(12) United States Patent
Xu et al.

(10) Patent No.: US 9,953,979 B2
(45) Date of Patent: Apr. 24, 2018

(54) CONTACT WRAP AROUND STRUCTURE

(71) Applicant: QUALCOMM Incorporated, San Diego, CA (US)

(72) Inventors: Jeffrey Junhao Xu, San Diego, CA (US); Stanley Seungchul Song, San Diego, CA (US); Vladimir Machkaoutsan, Leuven (BE); Mustafa Badaroglu, Leuven (BE); Junjing Bao, San Diego, CA (US); John Jianhong Zhu, San Diego, CA (US); Da Yang, San Diego, CA (US); Choh Fei Yeap, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/673,485

(22) Filed: Mar. 30, 2015

(65) Prior Publication Data
US 2016/0148936 A1 May 26, 2016

Related U.S. Application Data

(60) Provisional application No. 62/083,714, filed on Nov. 24, 2014.

(51) Int. Cl.
*H01L 29/76* (2006.01)
*H01L 21/70* (2006.01)
(Continued)

(52) U.S. Cl.
CPC ........ *H01L 27/0924* (2013.01); *H01L 21/285* (2013.01); *H01L 21/76897* (2013.01);
(Continued)

(58) Field of Classification Search
CPC ............... H01L 29/785; H01L 27/0924; H01L 29/66795; H01L 2029/7858; H01L 29/0669; H01L 27/0886; H01L 29/41791; H01L 29/7851; H01L 29/42392; H01L 21/823431; H01L 21/823821; H01L 29/6681
(Continued)

(56) References Cited

U.S. PATENT DOCUMENTS

| 8,766,319 | B2 | 7/2014 | Lai et al. |
| 2004/0169269 | A1 | 9/2004 | Yeo et al. |

(Continued)

FOREIGN PATENT DOCUMENTS

| DE | 102012110642 B3 | 9/2013 |
| WO | 2013095342 A1 | 6/2013 |
| WO | 2013095651 A1 | 6/2013 |
| WO | 2013101219 A1 | 7/2013 |

OTHER PUBLICATIONS

International Search Report and Written Opinion—PCT/US2015/053305—ISA/EPO—Mar. 2, 2016.

*Primary Examiner* — Fernando L Toledo
*Assistant Examiner* — Aaron Gray
(74) *Attorney, Agent, or Firm* — Seyfarth Shaw LLP

(57) ABSTRACT

A semiconductor device includes a gate stack. The semiconductor device also includes a wrap-around contact arranged around and contacting substantially all surface area of a regrown source/drain region of the semiconductor device proximate to the gate stack.

14 Claims, 22 Drawing Sheets

(51) Int. Cl.

| | |
|---|---|
| *H01L 27/088* | (2006.01) |
| *H01L 21/8238* | (2006.01) |
| *H01L 27/092* | (2006.01) |
| *H01L 29/423* | (2006.01) |
| *H01L 29/66* | (2006.01) |
| *H01L 29/417* | (2006.01) |
| *H01L 29/786* | (2006.01) |
| *H01L 29/775* | (2006.01) |
| *H01L 21/768* | (2006.01) |
| *H01L 21/285* | (2006.01) |
| *H01L 29/08* | (2006.01) |
| *H01L 29/78* | (2006.01) |
| *H01L 29/06* | (2006.01) |

(52) U.S. Cl.
CPC ........... *H01L 21/823821* (2013.01); *H01L 29/41791* (2013.01); *H01L 29/42392* (2013.01); *H01L 29/66545* (2013.01); *H01L 29/66795* (2013.01); *H01L 29/775* (2013.01); *H01L 29/785* (2013.01); *H01L 29/78696* (2013.01); *H01L 29/0673* (2013.01); *H01L 29/0847* (2013.01); *H01L 2029/7858* (2013.01)

(58) Field of Classification Search
USPC ......... 257/401, 369, 288, E21.431; 438/283, 438/198, 199, 222
See application file for complete search history.

(56) References Cited

U.S. PATENT DOCUMENTS

| | | | |
|---|---|---|---|
| 2006/0157749 A1 | 7/2006 | Okuno | |
| 2007/0132009 A1 | 6/2007 | Takeuchi et al. | |
| 2008/0265321 A1 | 10/2008 | Yu et al. | |
| 2011/0147840 A1 | 6/2011 | Cea et al. | |
| 2013/0071980 A1* | 3/2013 | Lin | H01L 29/045 438/300 |
| 2014/0001520 A1 | 1/2014 | Glass et al. | |
| 2014/0042500 A1* | 2/2014 | Wann | H01L 29/41791 257/288 |
| 2014/0054646 A1 | 2/2014 | Vellianitis | |
| 2014/0065782 A1* | 3/2014 | Lu | H01L 29/785 438/294 |
| 2014/0084340 A1 | 3/2014 | Wang et al. | |
| 2014/0110755 A1 | 4/2014 | Colinge | |
| 2014/0191314 A1 | 7/2014 | Wang et al. | |
| 2014/0203370 A1 | 7/2014 | Maeda et al. | |
| 2014/0225065 A1* | 8/2014 | Rachmady | H01L 29/42392 257/24 |
| 2014/0264634 A1* | 9/2014 | Lee | H01L 29/7854 257/407 |
| 2014/0273369 A1 | 9/2014 | Wei et al. | |
| 2014/0357040 A1* | 12/2014 | Loubet | H01L 29/66795 438/299 |
| 2016/0049516 A1* | 2/2016 | Huang | H01L 29/7853 257/401 |
| 2017/0054003 A1* | 2/2017 | Liao | H01L 29/66795 |

\* cited by examiner

CONTACT WRAP AROUND STRUCTURE

CROSS-REFERENCE TO RELATED APPLICATION

This application claims the benefit under 35 U.S.C. § 119(e) to U.S. Provisional Patent Application No. 62/083,714, entitled "CONTACT WRAP AROUND STRUCTURE," filed on Nov. 24, 2014, in the names of Jeffrey Junhao X U, et al., the disclosure of which is expressly incorporated by reference herein in its entirety.

BACKGROUND

Field

Aspects of the present disclosure relate to semiconductor devices, and more particularly to a contact wrap around structure.

Background

As integrated circuit (IC) technology advances, device geometries are reduced. Reducing the geometry and "pitch" (spacing) between devices may cause devices to interfere with each other in terms of proper operation.

Fin-based devices are three-dimensional structures on the surface of a semiconductor substrate. A fin-based transistor, which may be a fin-based metal-oxide-semiconductor field-effect transistor (MOSFET), may be referred to as a FinFET. A nanowire field-effect transistor (FET) is also a three-dimensional structure on the surface of a semiconductor substrate. A nanowire FET includes doped portions of the nanowire that contact a channel region and serve as the source and drain regions of the device. A nanowire FET is also an example of a MOSFET device.

The performance of MOSFET devices can be affected by numerous factors including channel length, strain and external resistance. One substantial factor that contributes to external resistance is contact resistance between the source/drain regions and the conductive layers. Contact resistances is a device performance and scaling limiter for advanced technology nodes in which the geometry and "pitch" (spacing) between devices is dramatically reduced.

SUMMARY

A semiconductor device includes a gate stack. The semiconductor device also includes a wrap-around contact arranged around and contacting substantially all surface area of a regrown source/drain region of the semiconductor device proximate to the gate stack.

A method of fabricating a semiconductor device including a contact wrap-around structure includes re-growing source/drain regions of the semiconductor device. The method also includes replacing a dummy gate of the semiconductor device with a gate stack. The method may further include fabricating a wrap-around contact arranged around and contacting substantially all surface area of a regrown source/drain region of the semiconductor device proximate to the gate stack.

A semiconductor device includes a gate stack. The semiconductor device also includes means for contacting substantially all surface area of a regrown source/drain region of the semiconductor device proximate to the gate stack.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of an aspect of the present disclosure, reference is now made to the following description taken in conjunction with the accompanying drawings.

DETAILED DESCRIPTION

Figure 1:
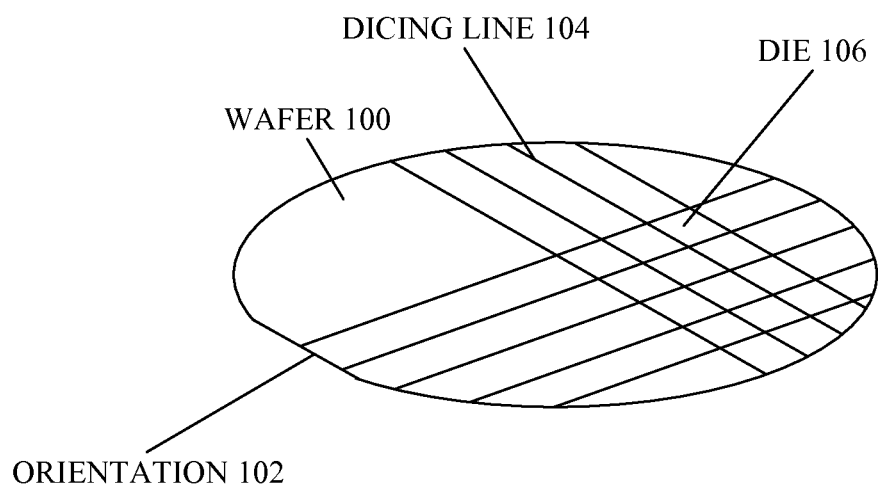
FIG. 1 illustrates a perspective view of a semiconductor wafer in an aspect of the present disclosure.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

Semiconductor fabrication processes are often divided into three parts: a front-end-of-line (FEOL), a middle-of-line (MOL) and a back-end-of line (BEOL). Front-end-of-line processes include wafer preparation, isolation, well formation, gate patterning, spacers, and dopant implantation. A middle-of-line process includes gate and terminal contact formation. The gate and terminal contact formation of the middle-of-line process, however, is an increasingly challenging part of the fabrication flow, particularly for lithography patterning. Back-end-of-line processes include forming interconnects and dielectric layers for coupling to the source/drain regions of the FEOL devices using non-silicide/non-geminide contact. These interconnects may be fabricated with a dual damascene process using plasma-enhanced chemical vapor deposition (PECVD) deposited inter-layer dielectric (ILD) materials.

As integrated circuit (IC) technology advances, device geometries are reduced. The geometry and "pitch" (spacing) between devices has substantially reduced in advanced logic technology. For example, in a seven (7) nanometer logic technology, the fin pitch is highly scaled (e.g., 21 to 24 nanometers) and the contacted gate pitch is also aggressively reduced (e.g., 39 to 45 nanometers).

Fin-based devices represent a significant advance in IC technology. Fin-based devices are three-dimensional structures on the surface of a semiconductor substrate. A fin-based transistor, which may be a fin-based metal-oxide-semiconductor field-effect transistor (MOSFET), may be referred to as a FinFET. A nanowire field-effect transistor (FET) also represents a significant advance in IC technology. A gate-all-around (GAA) nanowire-based device is also a three-dimensional structure on the surface of a semiconductor substrate. A GAA nanowire-based device includes doped portions of the nanowire that contact a channel region and serve as the source and drain regions of the device. A GAA nanowire-based device is also an example of a MOSFET device.

The performance of MOSFET devices can be affected by numerous factors including channel length, strain and external resistance. One substantial factor that contributes to external resistance is a contact resistance between the source/drain regions and the conductive layers (e.g., conductive interconnects). Contact resistance is a device performance and scaling limiter for advanced technology nodes in which the geometry and "pitch" (spacing) between devices is dramatically reduced.

As device geometries are reduced, and additional device structures are added to an integrated circuit, contact resistance becomes a substantial device performance and scaling limiter. For example, in advanced technology nodes in which the geometry and "pitch" (spacing) between devices is dramatically reduced, contact resistance may prohibit proper device operation. In particular, a reduced contact resistance is desired to continue support of improved device performance and density scaling for advanced logic technology, such as seven (7) nanometer logic technology. In fin-based devices as well as GAA-nanowire based devices, however, the geometry of the fins/gates, and the fin/gate pitch causes substantial contact resistance.

Various aspects of the disclosure provide techniques for fabricating a contact wrap-around structure for semiconductor devices. The process flow for semiconductor fabrication of the contact wrap around structure may include front-end-of-line (FEOL) processes, middle-of-line (MOL) processes, and back-end-of-line (BEOL) processes. It will be understood that the term "layer" includes film and is not to be construed as indicating a vertical or horizontal thickness unless otherwise stated. As described herein, the term "substrate" or may refer to a substrate of a diced wafer or may refer to the substrate of a wafer that is not diced. Similarly, the terms wafer and die may be used interchangeably unless such interchanging would tax credulity.

Aspects of the present disclosure include an innovative integration flow to form wrap-around contacts on highly scaled fins with metal-insulator-semiconductor (MIS) contacts or direct contacts to drastically reduce contact resistance. Additional aspects of the present disclosure can also provide an MIS contact or a direct contact to the source/drain of gate-all-around (GAA) nanowires-based devices and other like semiconductor device to reduce contact resistance. A contact wrap around structure, including wrap-around contacts, may enable operation within the reduced device geometries of advanced logic technology, such as seven (7) nanometer logic technology and beyond. A contact wrap-around structure may be fabricated using existing materials and process capabilities, while providing a substantial contact resistance reduction.

FIG. 1 illustrates a perspective view of a semiconductor wafer in an aspect of the present disclosure. A wafer 100 may be a semiconductor wafer, or may be a substrate material with one or more layers of semiconductor material on a surface of the wafer 100. When the wafer 100 is a semiconductor material, it may be grown from a seed crystal using the Czochralski process, where the seed crystal is dipped into a molten bath of semiconductor material and slowly rotated and removed from the bath. The molten material then crystallizes onto the seed crystal in the orientation of the crystal.

The wafer 100 may be a compound material, such as gallium arsenide (GaAs) or gallium nitride (GaN), a ternary material such as indium gallium arsenide (InGaAs), quaternary materials, or any material that can be a substrate material for other semiconductor materials. Although many of the materials may be crystalline in nature, polycrystalline or amorphous materials may also be used for the wafer 100.

The wafer 100, or layers that are coupled to the wafer 100, may be supplied with materials that make the wafer 100 more conductive. For example, and not by way of limitation, a silicon wafer may have phosphorus or boron added to the wafer 100 to allow for electrical charge to flow in the wafer 100. These additives are referred to as dopants, and provide extra charge carriers (either electrons or holes) within the wafer 100 or portions of the wafer 100. By selecting the areas where the extra charge carriers are provided, which type of charge carriers are provided, and the amount (density) of additional charge carriers in the wafer 100, different types of electronic devices may be formed in or on the wafer 100.

The wafer 100 has an orientation 102 that indicates the crystalline orientation of the wafer 100. The orientation 102 may be a flat edge of the wafer 100 as shown in FIG. 1, or may be a notch or other indicia to illustrate the crystalline orientation of the wafer 100. The orientation 102 may indicate the Miller Indices for the planes of the crystal lattice in the wafer 100.

The Miller Indices form a notation system of the crystallographic planes in crystal lattices. The lattice planes may be indicated by three integers h, k, and l, which are the Miller indices for a plane (hkl) in the crystal. Each index denotes a plane orthogonal to a direction (h, k, l) in the basis of the reciprocal lattice vectors. The integers are usually written in lowest terms (e.g., their greatest common divisor should be 1). Miller index 100 represents a plane orthogonal to direction h; index 010 represents a plane orthogonal to direction k, and index 001 represents a plane orthogonal to l. For some crystals, negative numbers are used (written as a bar over the index number) and for some crystals, such as gallium nitride, more than three numbers may be employed to adequately describe the different crystallographic planes.

Once the wafer 100 has been processed as desired, the wafer 100 is divided up along dicing lines 104. The dicing lines 104 indicate where the wafer 100 is to be broken apart or separated into pieces. The dicing lines 104 may define the outline of the various integrated circuits that have been fabricated on the wafer 100.

Once the dicing lines 104 are defined, the wafer 100 may be sawn or otherwise separated into pieces to form die 106. Each of the die 106 may be an integrated circuit with many devices or may be a single electronic device. The physical size of the die 106, which may also be referred to as a chip or a semiconductor chip, depends at least in part on the ability to separate the wafer 100 into certain sizes, as well as the number of individual devices that the die 106 is designed to contain.

Once the wafer 100 has been separated into one or more die 106, the die 106 may be mounted into packaging to allow access to the devices and/or integrated circuits fabricated on the die 106. Packaging may include single in-line packaging, dual in-line packaging, motherboard packaging, flip-chip packaging, indium dot/bump packaging, or other types of devices that provide access to the die 106. The die 106 may also be directly accessed through wire bonding, probes, or other connections without mounting the die 106 into a separate package.

Figure 2:
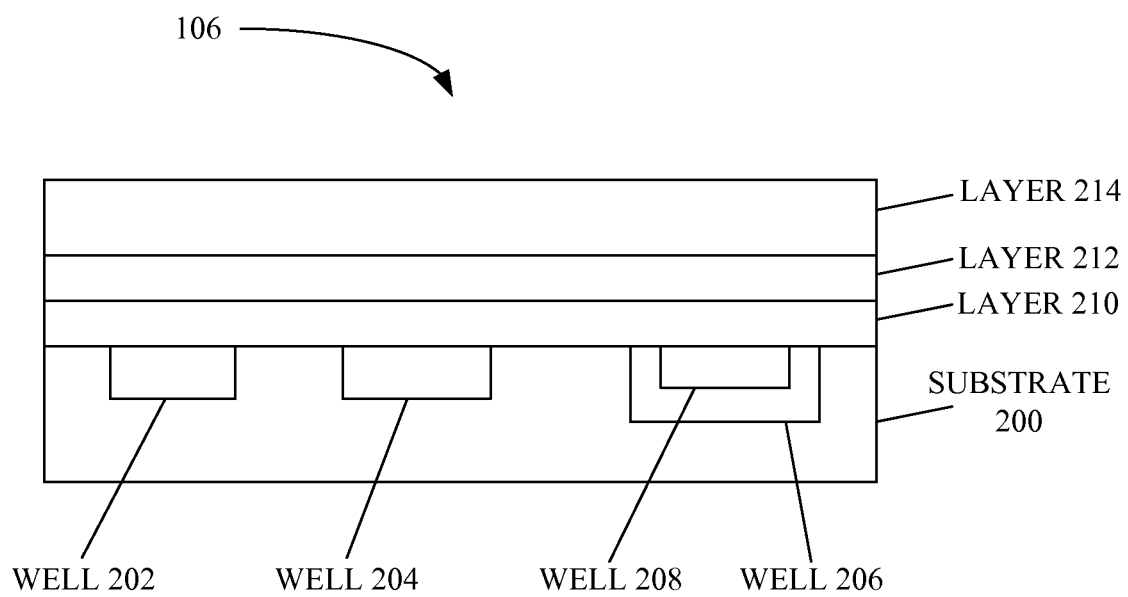
FIG. 2 illustrates a cross-sectional view of a die in accordance with an aspect of the present disclosure.

FIG. 2 illustrates a cross-sectional view of a die 106 in accordance with an aspect of the present disclosure. In the die 106, there may be a substrate 200, which may be a semiconductor material and/or may act as a mechanical support for electronic devices. The substrate 200 may be a doped semiconductor substrate, which has either electrons (designated N-channel) or holes (designated P-channel) charge carriers present throughout the substrate 200. Subsequent doping of the substrate 200 with charge carrier ions/atoms may change the charge carrying capabilities of the substrate 200.

Within a substrate 200 (e.g., a semiconductor substrate), there may be wells 202 and 204, which may be the source and/or drain of a field-effect transistor (FET), or wells 202 and/or 204 may be fin structures of a fin structured FET (FinFET). Wells 202 and/or 204 may also be other devices (e.g., a resistor, a capacitor, a diode, or other electronic devices) depending on the structure and other characteristics of the wells 202 and/or 204 and the surrounding structure of the substrate 200.

The semiconductor substrate may also have a well 206 and a well 208. The well 208 may be completely within the well 206, and, in some cases, may form a bipolar junction transistor (BJT). The well 206 may also be used as an isolation well to isolate the well 208 from electric and/or magnetic fields within the die 106.

Layers (e.g., 210 through 214) may be added to the die 106. The layer 210 may be, for example, an oxide or insulating layer that may isolate the wells (e.g., 202-208) from each other or from other devices on the die 106. In such cases, the layer 210 may be silicon dioxide, a polymer, a dielectric, or another electrically insulating layer. The layer 210 may also be an interconnection layer, in which case it may comprise a conductive material such as copper, tungsten, aluminum, an alloy, or other conductive or metallic materials.

The layer 212 may also be a dielectric or conductive layer, depending on the desired device characteristics and/or the materials of the layers (e.g., 210 and 214). The layer 214 may be an encapsulating layer, which may protect the layers (e.g., 210 and 212), as well as the wells 202-208 and the substrate 200, from external forces. For example, and not by way of limitation, the layer 214 may be a layer that protects the die 106 from mechanical damage, or the layer 214 may be a layer of material that protects the die 106 from electromagnetic or radiation damage.

Electronic devices designed on the die 106 may comprise many features or structural components. For example, the die 106 may be exposed to any number of methods to impart dopants into the substrate 200, the wells 202-208, and, if desired, the layers (e.g., 210-214). For example, and not by way of limitation, the die 106 may be exposed to ion implantation, deposition of dopant atoms that are driven into a crystalline lattice through a diffusion process, chemical vapor deposition, epitaxial growth, or other methods. Through selective growth, material selection, and removal of portions of the layers (e.g., 210-214), and through selective removal, material selection, and dopant concentration of the substrate 200 and the wells 202-208, many different structures and electronic devices may be formed within the scope of the present disclosure.

Further, the substrate 200, the wells 202-208, and the layers (e.g., 210-214) may be selectively removed or added through various processes. Chemical wet etching, chemical mechanical planarization (CMP), plasma etching, photoresist masking, damascene processes, and other methods may create the structures and devices of the present disclosure.

Figure 3:
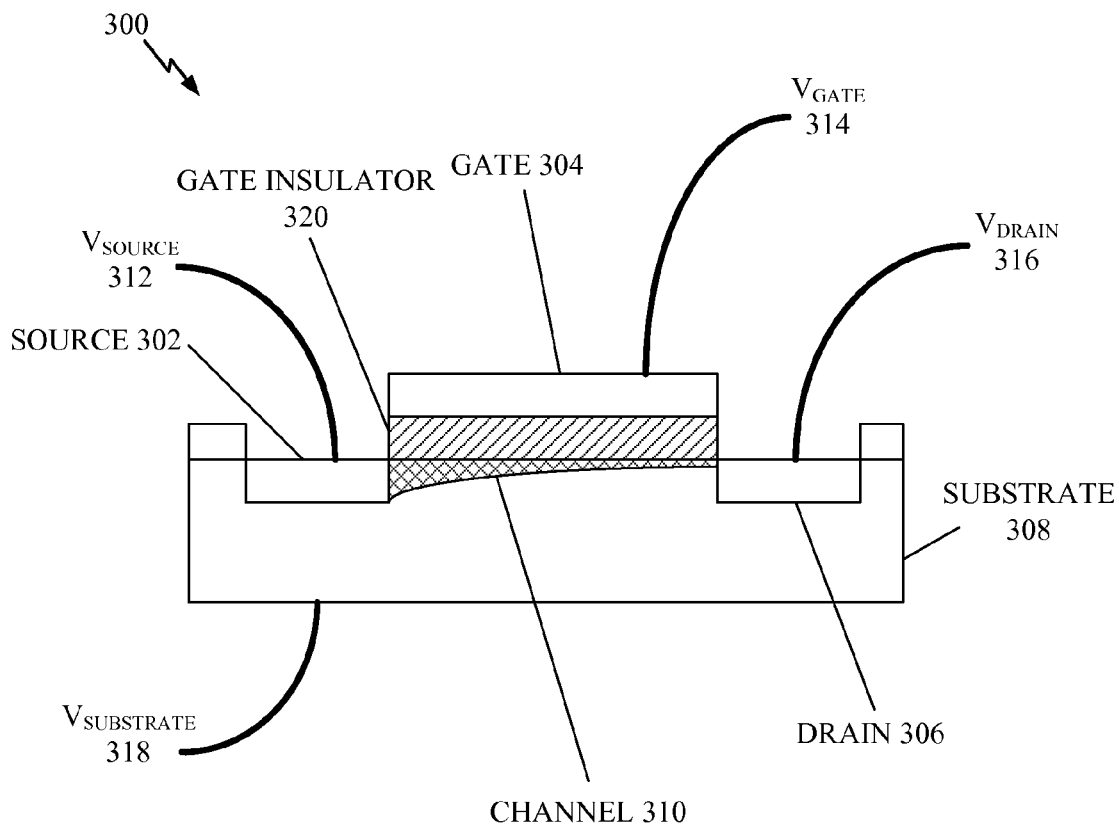
FIG. 3 illustrates a cross-sectional view of a metal-oxide-semiconductor field-effect transistor (MOSFET) device in an aspect of the present disclosure.
Figure 3:
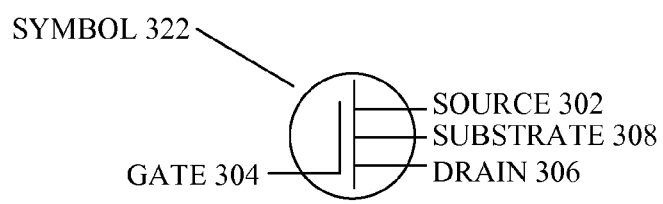

FIG. 3 illustrates a cross-sectional view of a metal-oxide-semiconductor field-effect transistor (MOSFET) device 300 in an aspect of the present disclosure. The MOSFET device 300 may have four input terminals. The four inputs are a source 302, a gate 304, a drain 306, and a substrate 308. The source 302 and the drain 306 may be fabricated as the wells 202 and 204 in the substrate 308, or may be fabricated as areas above the substrate 308, or as part of other layers on the die 106. Such other structures may be a fin or other structure that protrudes from a surface of the substrate 308. Further, the substrate 308 may be the substrate 200 on the die 106, but substrate 308 may also be one or more of the layers (e.g., 210-214) that are coupled to the substrate 200.

The MOSFET device 300 is a unipolar device, as electrical current is produced by only one type of charge carrier (e.g., either electrons or holes) depending on the type of MOSFET. The MOSFET device 300 operates by controlling the amount of charge carriers in the channel 310 between the source 302 and the drain 306. A voltage Vsource 312 is applied to the source 302, a voltage Vgate 314 is applied to the gate 304, and a voltage Vdrain 316 is applied to the drain 306. A separate voltage Vsubstrate 318 may also be applied to the substrate 308, although the voltage Vsubstrate 318 may be coupled to one of the voltage Vsource 312, the voltage Vgate 314 or the voltage Vdrain 316.

To control the charge carriers in the channel 310, the voltage Vgate 314 creates an electric field in the channel 310 when the gate 304 accumulates charges. The opposite charge to that accumulating on the gate 304 begins to accumulate in the channel 310. The gate insulator 320 insulates the charges accumulating on the gate 304 from the source 302, the drain 306, and the channel 310. The gate 304 and the channel 310, with the gate insulator 320 in between, create a capacitor, and as the voltage Vgate 314 increases, the charge carriers on the gate 304, acting as one plate of this capacitor, begin to accumulate. This accumulation of charges on the gate 304 attracts the opposite charge carriers into the channel 310. Eventually, enough charge carriers are accumulated in the channel 310 to provide an electrically conductive path between the source 302 and the drain 306. This condition may be referred to as opening the channel of the FET.

By changing the voltage Vsource 312 and the voltage Vdrain 316, and their relationship to the voltage Vgate 314, the amount of voltage applied to the gate 304 that opens the channel 310 may vary. For example, the voltage Vsource 312 is usually of a higher potential than that of the voltage Vdrain 316. Making the voltage differential between the voltage Vsource 312 and the voltage Vdrain 316 larger will change the amount of the voltage Vgate 314 used to open the channel 310. Further, a larger voltage differential will change the amount of electromotive force moving charge carriers through the channel 310, creating a larger current through the channel 310.

The gate insulator 320 material may be silicon oxide, or may be a dielectric or other material with a different dielectric constant (k) than silicon oxide. Further, the gate insulator 320 may be a combination of materials or different layers of materials. For example, the gate insulator 320 may be Aluminum Oxide, Hafnium Oxide, Hafnium Oxide Nitride, Zirconium Oxide, or laminates and/or alloys of these materials. Other materials for the gate insulator 320 may be used without departing from the scope of the present disclosure.

By changing the material for the gate insulator 320, and the thickness of the gate insulator 320 (e.g., the distance between the gate 304 and the channel 310), the amount of charge on the gate 304 to open the channel 310 may vary. A symbol 322 showing the terminals of the MOSFET device 300 is also illustrated. For N-channel MOSFETs (using electrons as charge carriers in the channel 310), an arrow is applied to the substrate 308 terminal in the symbol 322 pointing away from the gate 304 terminal. For p-type MOSFETs (using holes as charge carriers in the channel 310), an arrow is applied to the substrate 308 terminal in the symbol 322 pointing toward the gate 304 terminal.

The gate 304 may also be made of different materials. In some designs, the gate 304 is made from polycrystalline silicon, also referred to as polysilicon or poly, which is a conductive form of silicon. Although referred to as "poly" or "polysilicon" herein, metals, alloys, or other electrically conductive materials are contemplated as appropriate materials for the gate 304 as described in the present disclosure.

In some MOSFET designs, a high-k value material may be desired in the gate insulator 320, and in such designs, other conductive materials may be employed. For example, and not by way of limitation, a "high-k metal gate" design may employ a metal, such as copper, for the gate 304 terminal Although referred to as "metal," polycrystalline materials, alloys, or other electrically conductive materials are contemplated as appropriate materials for the gate 304 as described in the present disclosure.

To interconnect to the MOSFET device 300, or to interconnect to other devices in the die 106 (e.g., semiconductor), interconnect traces or layers are used. These interconnect traces may be in one or more of layers (e.g., 210-214), or may be in other layers of the die 106.

Figure 4:
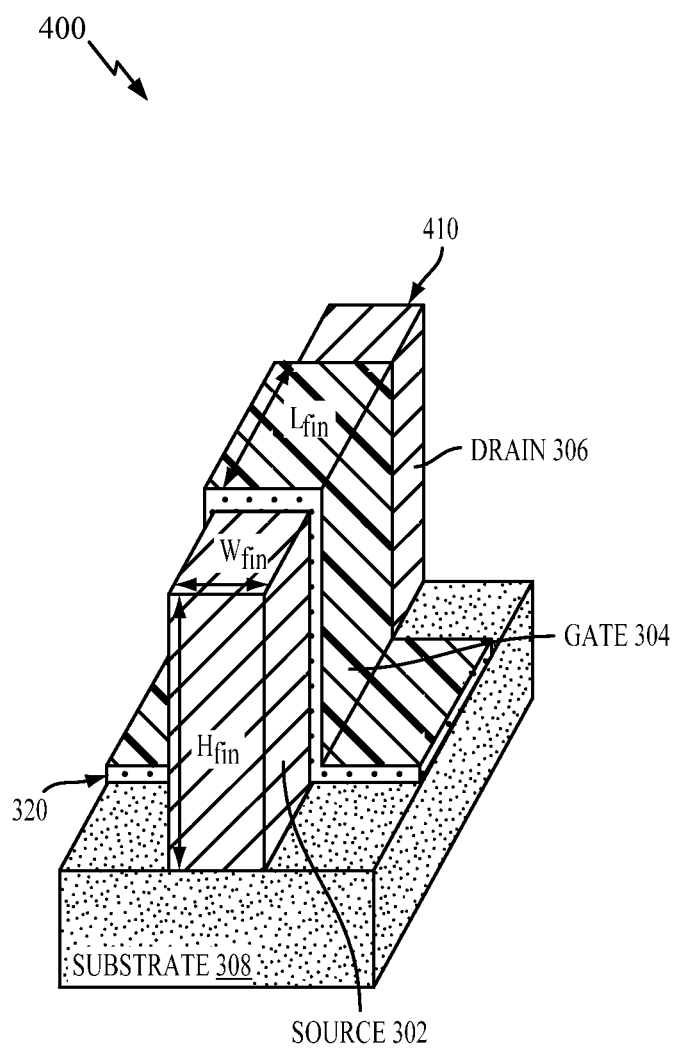
FIG. 4 illustrates a fin field-effect transistor (FinFET) in accordance with an aspect of the present disclosure.

FIG. 4 illustrates a transistor in accordance with an aspect of the present disclosure. A fin-structured FET (FinFET 400) operates in a similar fashion to the MOSFET device 300 described with respect to FIG. 3. A fin 410 in a FinFET 400, however, is grown or otherwise coupled to the substrate 308. The substrate 308 may be a semiconductor substrate or other like supporting layer, for example, comprised of an oxide layer, a nitride layer, a metal oxide layer or a silicon layer. The fin 410 includes the source 302 and the drain 306. A gate 304 is disposed on the fin 410 and on the substrate 308 through a gate insulator 320. A height, Hfin, a width, Wfin, and a length, Lfin, represent the dimensions of the fin. In a FinFET structure, the physical size of the FinFET 400 may be smaller than the MOSFET device 300 structure shown in FIG. 3. This reduction in physical size allows for more devices per unit area on the die 106.

Contact Wrap Around Structure

Fin-based devices represent a significant advance in IC technology. Fin-based devices are three-dimensional structures on the surface of a semiconductor substrate. A fin-based transistor, which may be a fin-based metal-oxide-semiconductor field-effect transistor (MOSFET), may be referred to as a FinFET. A nanowire field-effect transistor (FET) also represents a significant advance in IC technology. A gate-all-around (GAA) nanowire-based device is also a three-dimensional structure on the surface of a semiconductor substrate. A GAA nanowire-based device includes doped portions of the nanowire that contact a channel region and serve as the source and drain regions of the device. A GAA nanowire-based device is also an example of a MOSFET device. In one configuration, a gate-all-around nanowire field-effect transistor (FET) is described.

The performance of MOSFET devices can be affected by numerous factors including channel length, strain and external resistance. One substantial factor that contributes to external resistance is a contact resistance between the source/drain regions and the conductive layers. Contact resistance is a device performance and scaling limiter for advanced technology nodes in which the geometry and "pitch" (spacing) between devices is dramatically reduced.

As device geometries are reduced, and additional device structures are added to an integrated circuit, contact resistance becomes a substantial device performance and scaling limiter. For example, in advanced technology nodes in which the geometry and "pitch" (spacing) between devices is dramatically reduced, contact resistance may prohibit proper device operation. In particular, a reduced contact resistance is desired to continue support of improved device performance and density scaling for advanced logic technology, such as seven (7) nanometer logic technology and beyond. In fin-based devices as well as GAA-nanowire based devices, however, the geometry of the fins/gates, and the fin/gate pitch causes substantial contact resistance.

Various aspects of the disclosure provide techniques for fabricating a contact wrap-around structure for semiconductor devices. The process flow for semiconductor fabrication of the contact wrap around structure may include front-end-of-line (FEOL) processes, middle-of-line (MOL) processes, and back-end-of-line (BEOL) processes. It will be understood that the term "layer" includes film and is not to be construed as indicating a vertical or horizontal thickness unless otherwise stated. As described herein, the term "substrate" or may refer to a substrate of a diced wafer or may refer to the substrate of a wafer that is not diced. Similarly, the terms wafer and die may be used interchangeably unless such interchanging would tax credulity.

Aspects of the present disclosure include an innovative integration flow to form wrap-around contacts on highly scaled fins with metal-insulator-semiconductor (MIS) contacts or direct contacts to drastically reduce contact resistance. Additional aspects of the present disclosure can also provide an MIS contact or a direct contact to the source/drain of gate-all-around (GAA) nanowires-based devices and other like semiconductor devices to reduce contact resistance. Contact wrap around structures, including wrap-around contacts, may enable operation within the reduced device geometries of advanced logic technology. A contact wrap-around structure may be fabricated using existing materials and process capabilities, while providing a substantial contact resistance reduction.

Figure 5A:
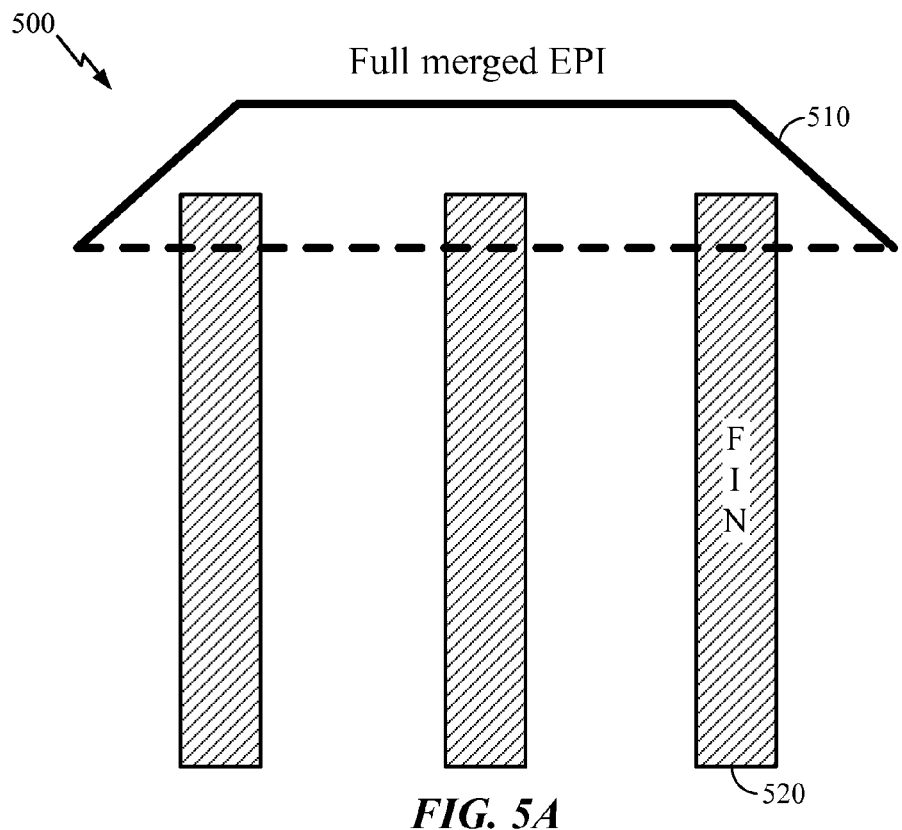
FIGS. 5A and 5B illustrate cross-sectional views of fin-based structures including conventional contact structures.

FIG. 5A illustrates a cross-sectional view of a fin-based structure 500 including a first conventional contact structure 510. The fin-based structure 500 may be used within an integrated circuit. The fins 520 may be supported by a substrate (not shown) and doped with a specific type of charge carrier, such that the fins 520 are conductive. The substrate may be a semiconductor substrate, a silicon on insulator (SOI) substrate, a buried oxide (BOX) layer, or the like. An SOI substrate may be fully depleted. The fins 520 may be doped with an n-type dopant or a p-type dopant depending on the type of charge carrier desired in the final device.

The first conventional contact structure 510 to the fins 520 are fabricated using a fully merged epitaxial growth or other like process. A contact area (CA) of the first conventional contact structure 510 provided by the fully merged epitaxial growth may be determined as follows:

$$CA=CD*[(NF-1)*FP+FP/\cos(55°)], \quad (1)$$

where CD is the critical dimension, NF is the number of fins, and FP is the fin pitch to enable the contact surface area calculation for the first conventional contact structure 510.

Figure 5B:
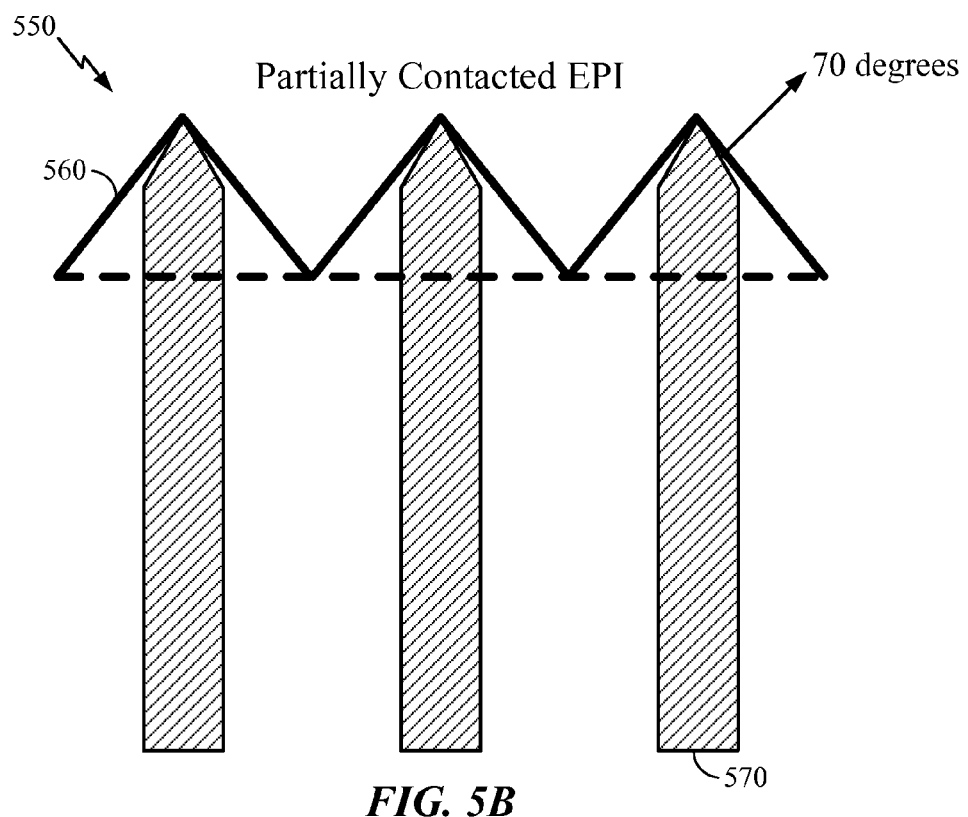

FIG. 5B illustrates a cross-sectional view of a fin-based structure 550 including a second conventional contact structure 560 to the fins 570. The fin-based structure 550 may also be used within an integrated circuit. The fins 570 may be supported by a substrate (not shown) and doped with a specific type of charge carrier, such that the fins 570 are conductive. The fins 570 may also be doped with an n-type dopant or a p-type dopant depending on the type of charge carrier specified for the final device.

The second conventional contact structure 560 is fabricated using a partially contacted epitaxial growth or other like process. In this arrangement, the second conventional contact structure 560 is fabricated at a seventy degree (70°) angle. A contact area (CA) of the second conventional contact structure 560 provided by the partially contacted epitaxial growth may be determined as follows:

$$CA=CD*FP/\cos(55°)*NF, \quad (2)$$

where CD is the critical dimension, NF is the number of fins, and FP is the fin pitch to enable the contact surface area calculation for the second conventional contact structure 560.

Figure 6:
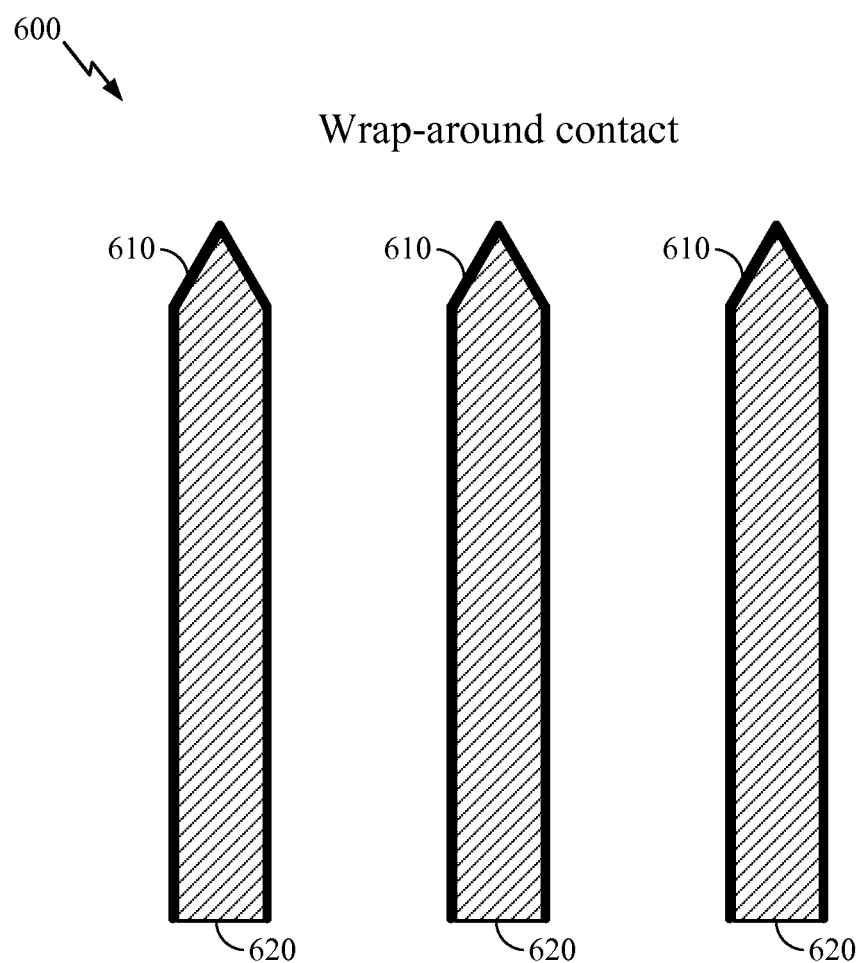
FIG. 6 illustrates a cross-sectional view of a fin-based structure including a wrap-around contact in accordance with an aspect of the present disclosure.

FIG. 6 illustrates a cross-sectional view of a fin-based structure 600 including a wrap-around contact 610 in accordance with an aspect of the present disclosure. The fin-based structure 600 may also be used within an integrated circuit. The fins 620 may be supported by a substrate (not shown) and doped with a specific type of charge carrier, such that the fins 620 are conductive. The fins 620 may be doped with an n-type dopant or a p-type dopant depending on the type of charge carrier desired in the final device.

The wrap-around contact 610 is fabricated using, for example, a metal-insulator-semiconductor (MIS) contact or a direct contact, rather than relying on growth or other like process. A contact area of the wrap-around contact 610 provided by the MIS contact or the direct contact may be determined as follows:

$$CA=CD*(2*FH+FW/\cos(55°))*NF, \quad (3)$$

where CD is the critical dimension, NF is the number of fins, FH is the fin height, FW is the fin width and FP is the fin pitch to enable the contact surface area calculation for the wrap-around contact 610.

For example, in seven (7) nanometer logic technology, CD=14 nanometers, FP=24 nanometers, FH=35 nanometers, FW=6 nanometers, and NF=3. Based on these values, the contact surface area for the first conventional contact structure 510 may be computed according to equation (1), such that CD=14*[(3−1)*24+24/0.57]=14*90=>x1.00. Based on these values, the contact surface area for the second conventional contact structure 560 may be computed according to equation (2), such that CD=14*24/0.57*3=14*126=>x1.40. Using these same values, the contact surface area for the wrap-around contact 610 may be computed according to equation (3), such that CD=14*(2*35+6/0.57)*3=14*241=>x2.68. Assuming FH=60 nanometers, the contact surface area for the wrap-around contact 610 is x4.35 greater than the contact surface area for the first conventional contact structure 510, and x3.11 greater than the contact surface area for the second conventional contact structure 560, which may reduce the contact resistance by approximately fifty percent (50%).

Figure 7A:
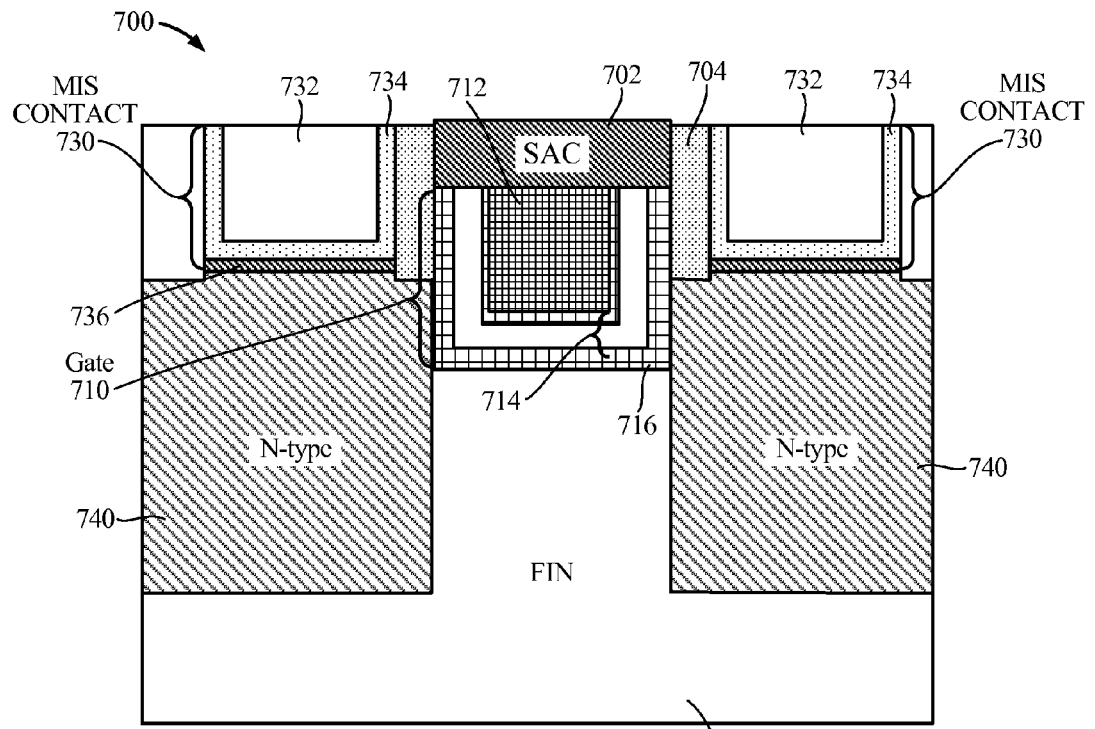
FIGS. 7A and 7B illustrate cross-sectional views of complementary metal oxide semiconductor (CMOS) devices, including an MIS contact or a direct contact according to an aspect of the present disclosure.
Figure 7B:
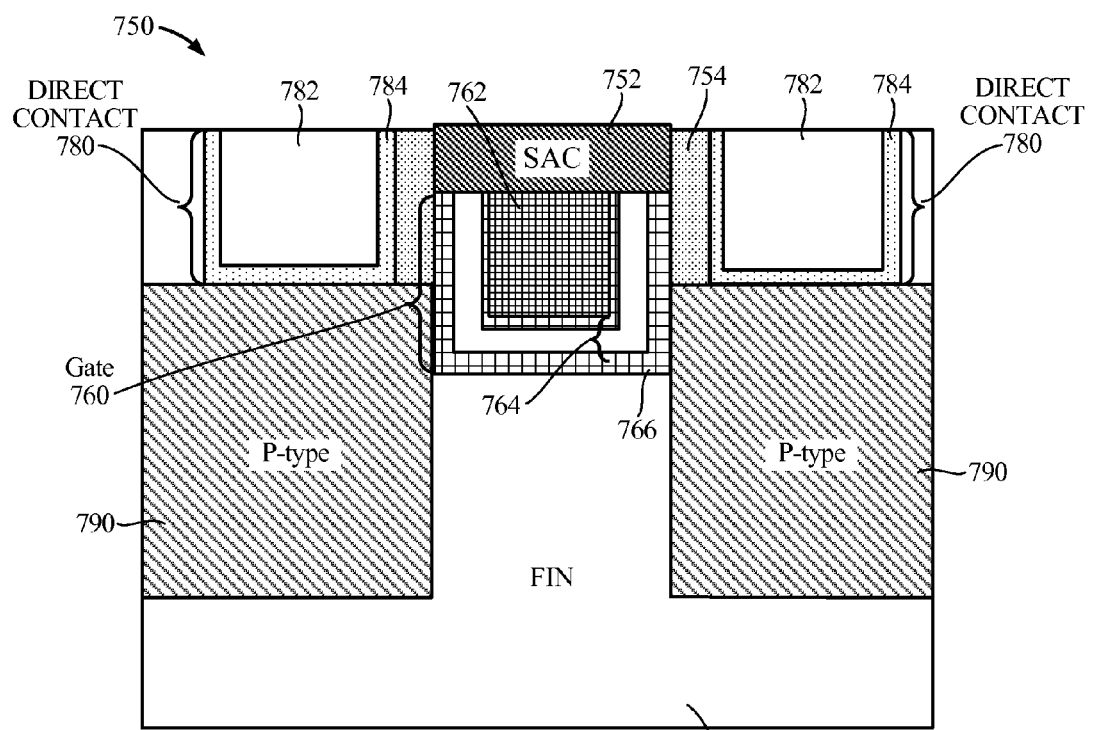

FIGS. 7A and 7B illustrate cross-sectional views of complementary metal oxide semiconductor devices (CMOS) including an MIS contact 730 or a direct contact 780 according to an aspect of the present disclosure. In FIG. 7A, an n-type CMOS device (NMOS device 700) includes n-type metal oxide semiconductor (NMOS) region 740 surrounding a fin 720. The n-type regions 740 may be composed of phosphorous doped silicon (Si—P) to provide the n-type regions 740. A gate 710 is formed on the fin 720. The gate 710 includes a high-K layer 716, an n-type work function layer 714 and a conductive layer 712 (e.g., tungsten (W) or cobalt (Co)). A self-aligned contact 702 is disposed on the gate 710 and a gate spacer 704 is disposed on sidewalls of the gate 710.

An aspect of the present disclosure envisions a non-silicide contact to the source/drain regions of the NMOS device 700. In this arrangement, a metal-insulator-semiconductor (MIS) contact 730 may be deposited on the source/drain regions (e.g., the n-type regions 740) of the NMOS device 700. The MIS contact 730 may include a first layer 736 (e.g., a titanium oxide layer (TiO$_2$)) on the n-type regions 740. The MIS contact 730 may include a second layer 734 (e.g., titanium (Ti)) on the first layer 736 and on sidewalls of a conductive material 732.

For the n-type regions 740 (e.g., source/drain) of the NMOS device 700, chemical vapor deposition (CVD) or physical vapor deposition (PVD) of the second layer 734 (e.g., a titanium layer (Ti)) will react with the first layer 736 (e.g., titanium oxide (TiO$_2$)) to form low resistivity Ti/TiO$_{2-x}$ of the MIS Contact 730 on phosphorous doped silicon material of the n-type regions 740. Alternatively, a direct contact (e.g., titanium (Ti)) on phosphorous doped silicon material of the n-type regions 740 is also an option. A contact resistivity provided by the MIS contact 730 (or the direct contact) is in the range of 7E-9 ohms per cubic centimeter (Ohm-cm$^2$) when deposited on the phosphorous doped silicon material of the n-type regions 740.

In FIG. 7B, a p-type CMOS device (PMOS device 750) includes a p-type metal oxide semiconductor (PMOS) region 790 surrounding a fin 720. The p-type regions 790 may be composed of boron doped silicon germanium (SiGe—B) to provide the p-type regions 790. A gate 760 is formed on the fin 770. The gate 760 includes a high-K layer 766, a p-type work function layer 764 and a conductive layer 762 (e.g., tungsten (W)). A self-aligned contact 752 is disposed on the gate 760 and a gate spacer 754 is disposed on sidewalls of the gate 760.

An aspect of the present disclosure envisions a non-geminide contact to the source/drain regions of the PMOS device 750. In this arrangement, a direct contact 780 may be deposited on the source/drain regions (e.g., the p-type regions 790) of the PMOS device 750. The direct contact 780 may include a first layer 784 (e.g., titanium (Ti)) on the p-type regions 790 and on sidewalls of a conductive material 782. A contact resistivity provided by the direct contact 780 is in the range of 2E-8 ohms per cubic centimeter (Ohm-cm$^2$) when deposited on boron doped germanium material of the p-type regions 790.

Figure 8:
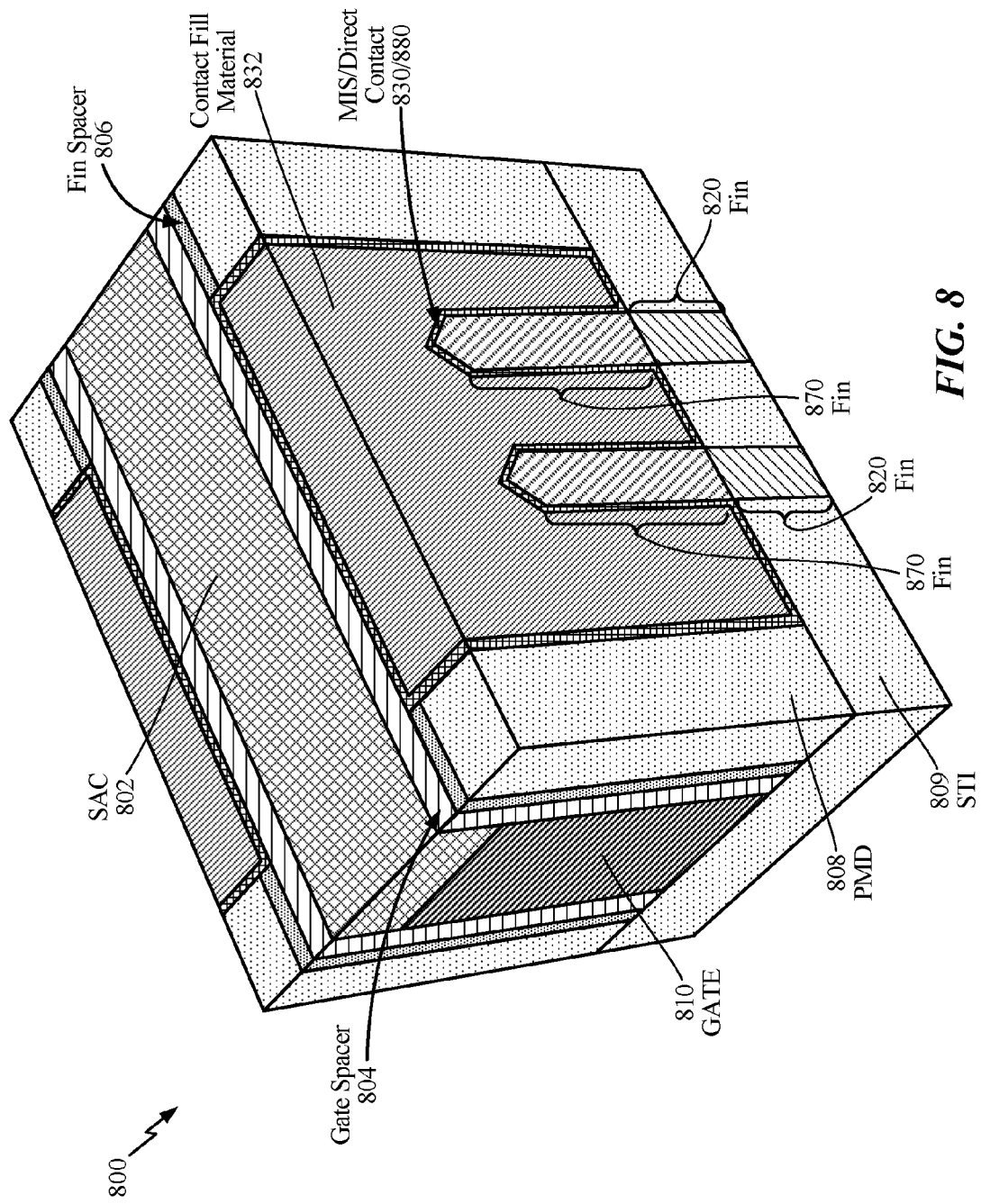
FIG. 8 illustrates a cross-sectional view of a fin-based device including a contact wrap-around structure in accordance with an aspect of the present disclosure.

FIG. 8 illustrates a cross-sectional view of a fin-based device 800 including a contact wrap-around structure in accordance with an aspect of the present disclosure. Representatively, the fin-based device 800 includes a shallow trench isolation (STI) region 809 surrounding a base fin-portion 820. The base fin-portion 820 may be silicon, germanium, silicon germanium, indium phosphate, or other like semiconductor material. A regrown fin-portion 870 is formed on the base fin-portion 820 using, for example, epitaxial growth with a controlled (111) Miller index facet formation without merging the fins. The regrown fin-portion 870 operates as a source/drain of the fin-based device 800. For a fin-based device 800 that is of an n-type (e.g., an NFET), the regrown fin-portion 870 is composed of phosphorous doped silicon (SiP), carbon phosphorous doped silicon (SiCP), phosphorous doped silicon germanium (SiGeP), phosphorous doped germanium (GeP), or other like three/five (III/V) material. For a fin-based device 800 that is of a p-type (e.g., a PFET), the regrown fin-portion 870 is composed of boron doped silicon germanium (SiGeB), boron doped germanium (GeB), or other like doped material.

In this arrangement, an MIS contact 830 or a direct contact 880 surrounds the regrown fin-portion 870 (source/drain) of the fin-based device 800. A contact fill material 832 (e.g., tungsten (W) or cobalt (Co)) is disposed on the material of the MIS contact 830 or the direct contact 880 surrounding the regrown fin-portion 870. In addition, an oxide (e.g., a pre-metal dielectric (PMD) 808) is on sidewalls of the material of the MIS contact 830 or the direct contact 880 and a fin spacer 806. The fin-based device 800 also includes a gate 810 including a self-aligned contact (SAC) 802 (e.g., nitride-based SAC) on the gate 810 and a gate spacer 804 (e.g., a nitride-based low-K gate spacer) on sidewalls of the gate 810. The SAC 802 may also provide an etch stop for fabricating the gate 810. The fin-based device 800 may be formed as shown in FIGS. 9A-9L. A gate-all-around (GAA) nanowire-based device 1000 may be formed as shown in FIGS. 10A-10L, which correspond to FIGS. 9A-9L. A process for forming the fin-based device 800, as shown in FIGS. 9A-9L or the GAA nanowire-based device 1000, as shown in FIGS. 10A-10L, which correspond to FIGS. 9A-9L, is described with reference to FIGS. 11A and 11B.

Figure 9A:
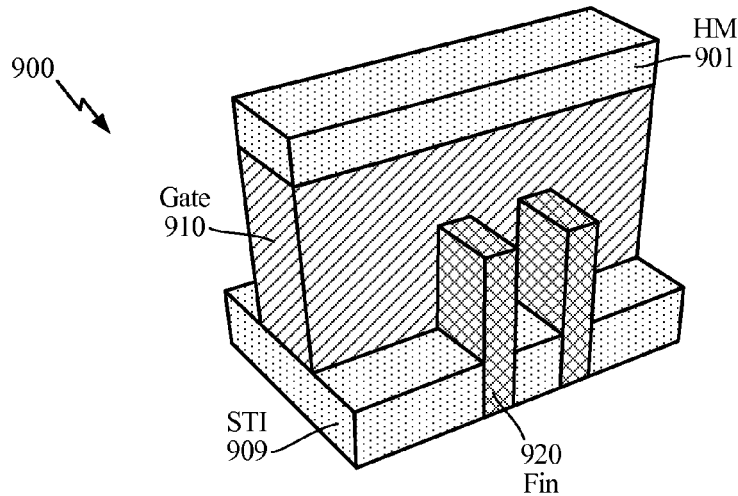
FIGS. 9A-9L are cross-sectional views illustrating the formation of a fin-based device including wrap-around contacts in an aspect of the present disclosure.
Figure 9B:
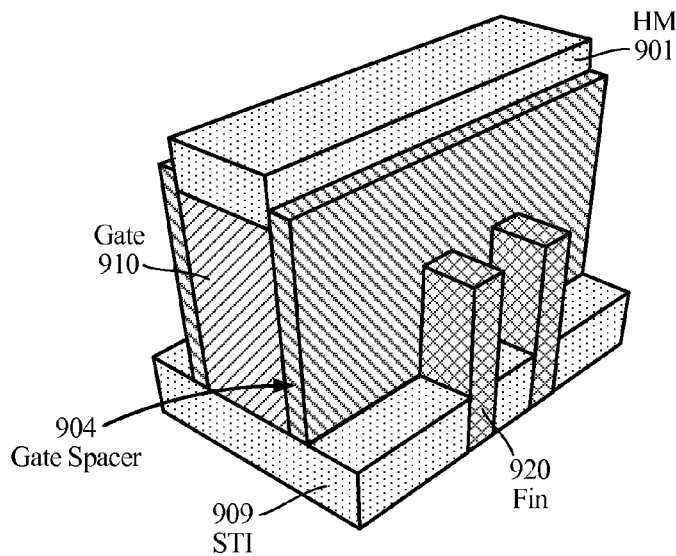
Figure 9C:
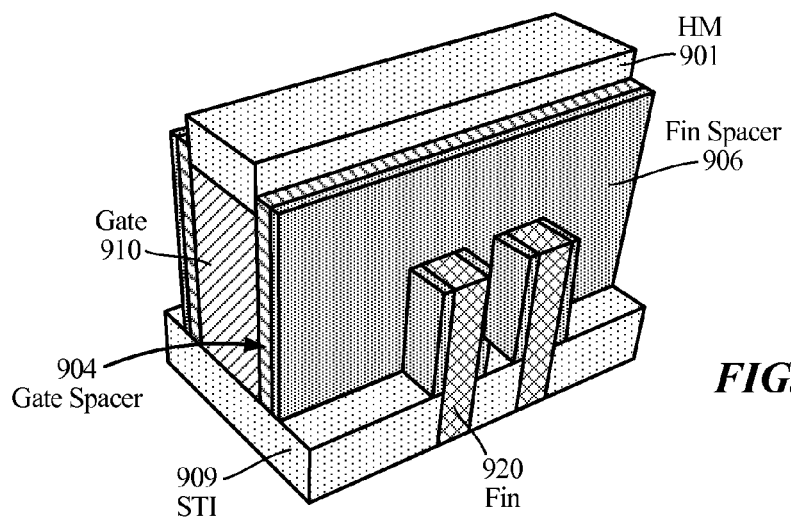
Figure 9D:
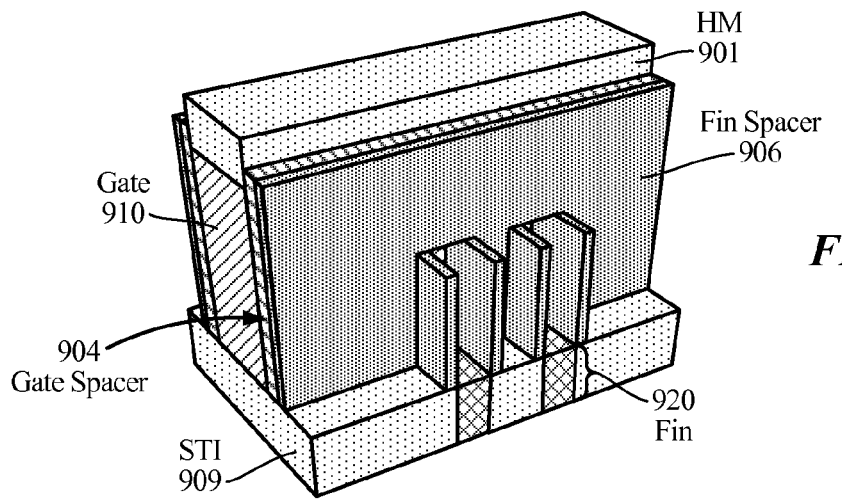
Figure 9E:
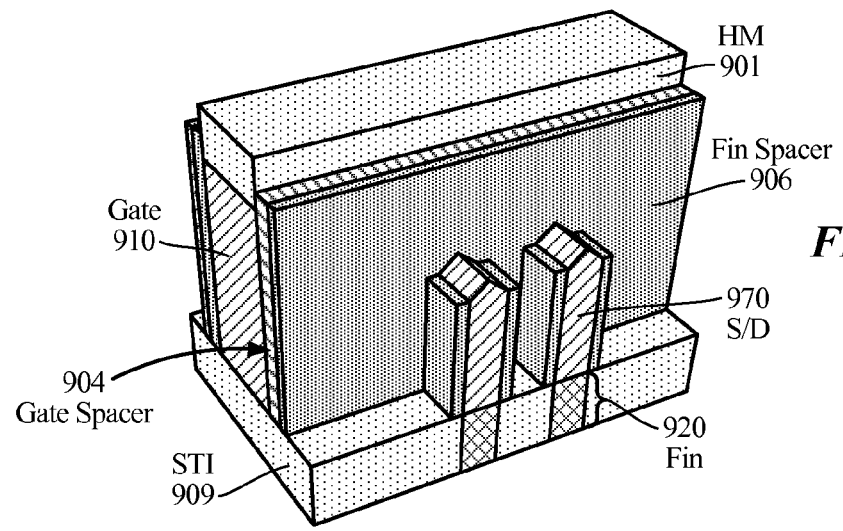
Figure 9F:
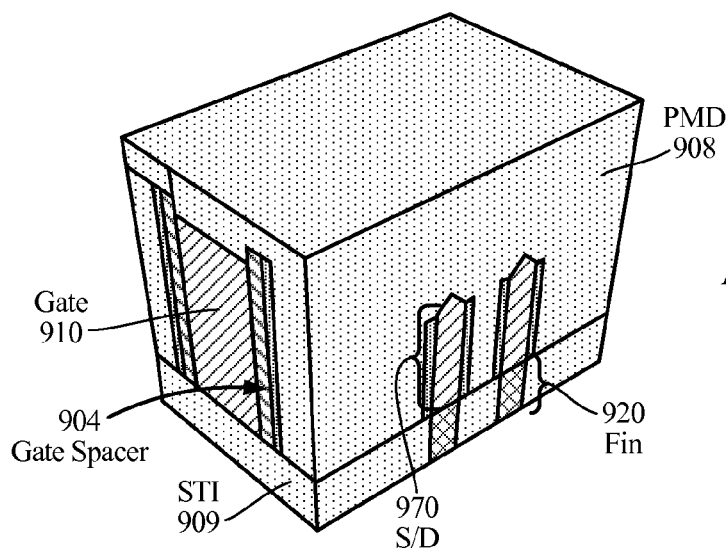
Figure 9G:
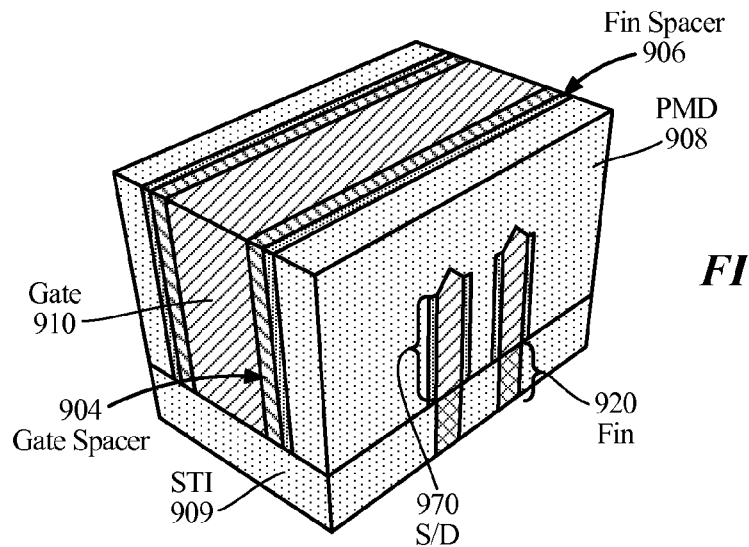
Figure 9H:
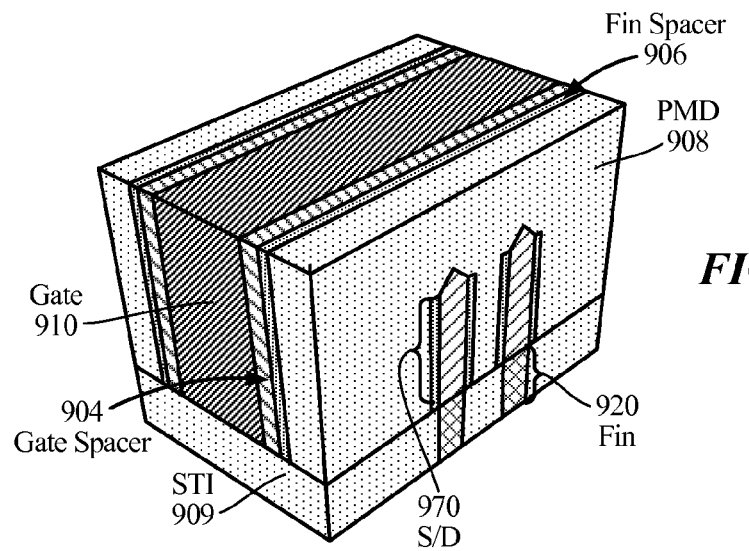
Figure 9I:
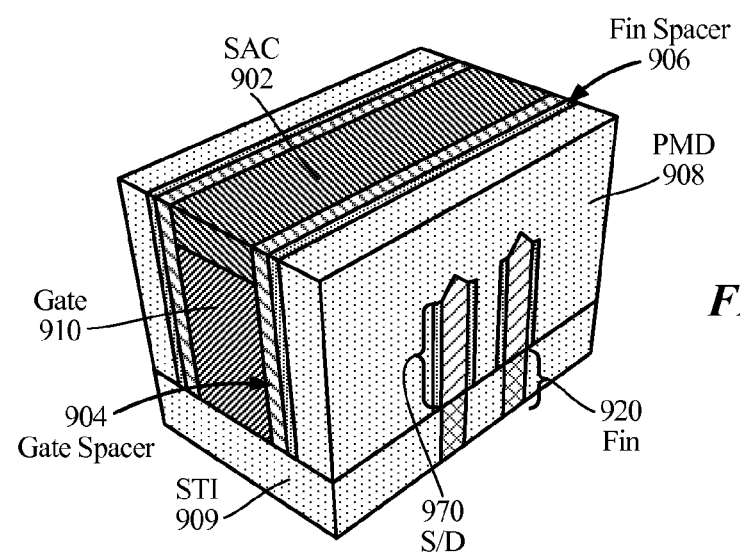
Figure 9J:
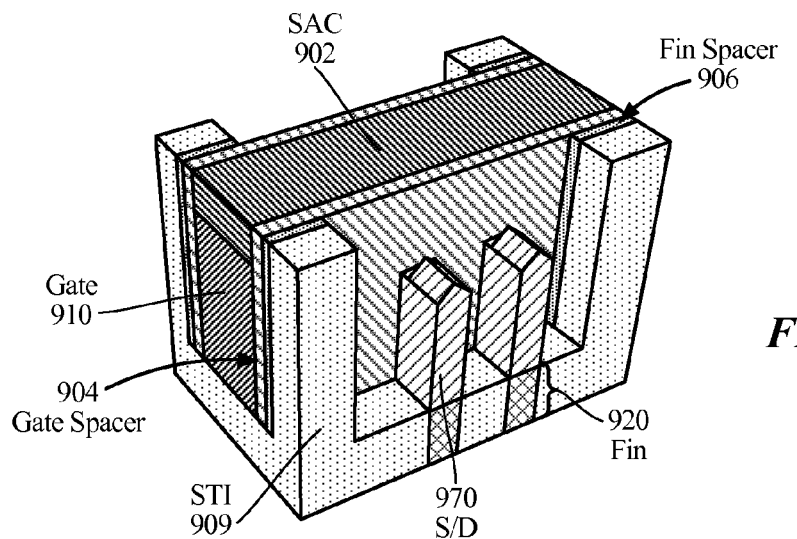
Figure 9K:
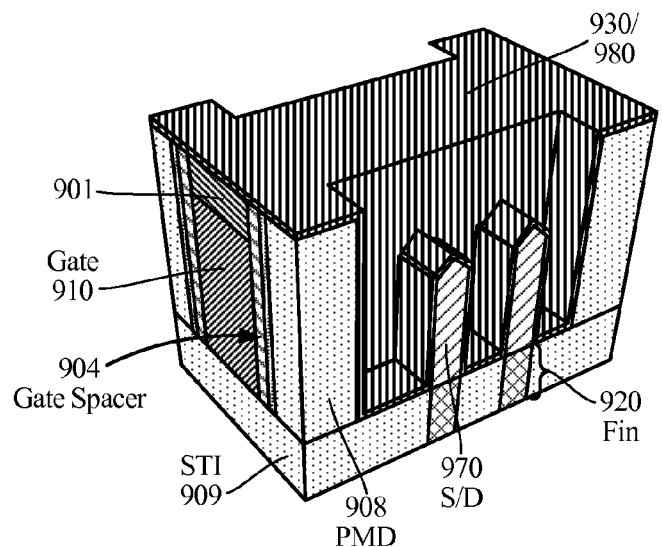
Figure 9L:
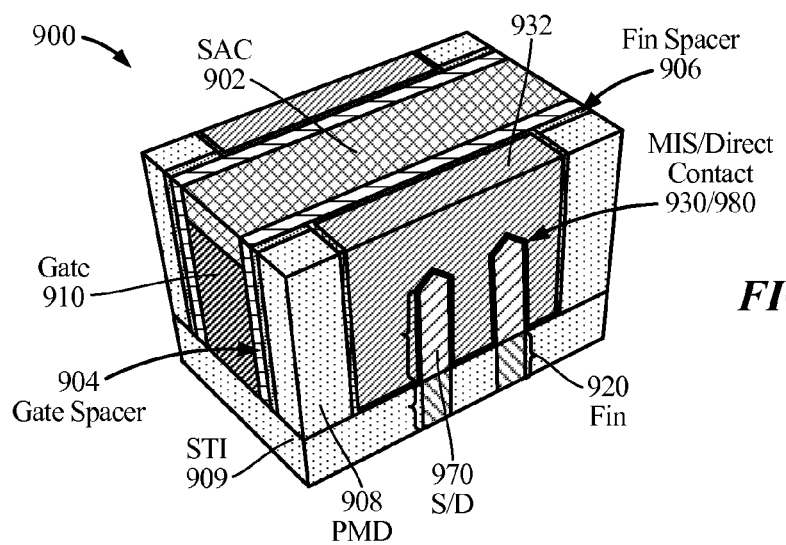
Figure 10A:
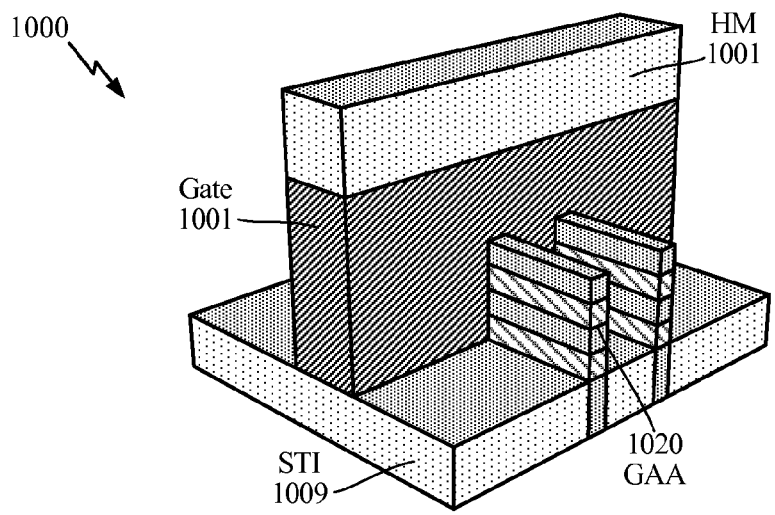
FIGS. 10A-10L are cross-sectional views illustrating the formation of a gate-all-around (GAA) nanowire-based device including wrap-around contacts in accordance with aspects of the present disclosure.
Figure 10B:
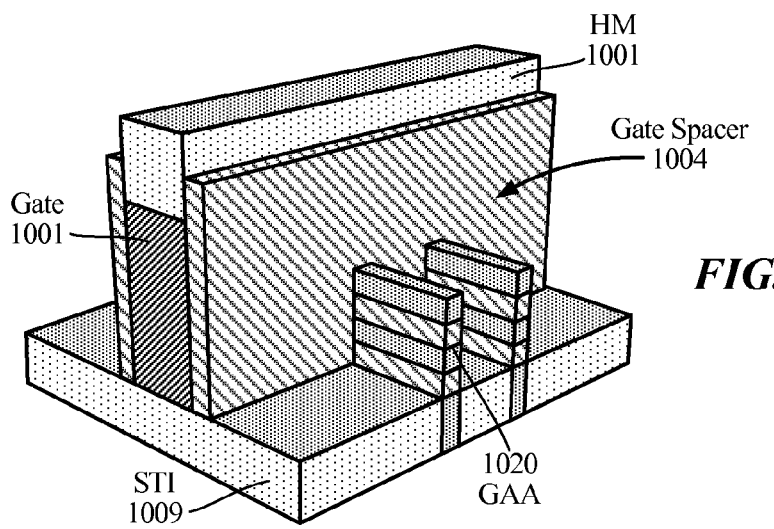
Figure 10C:
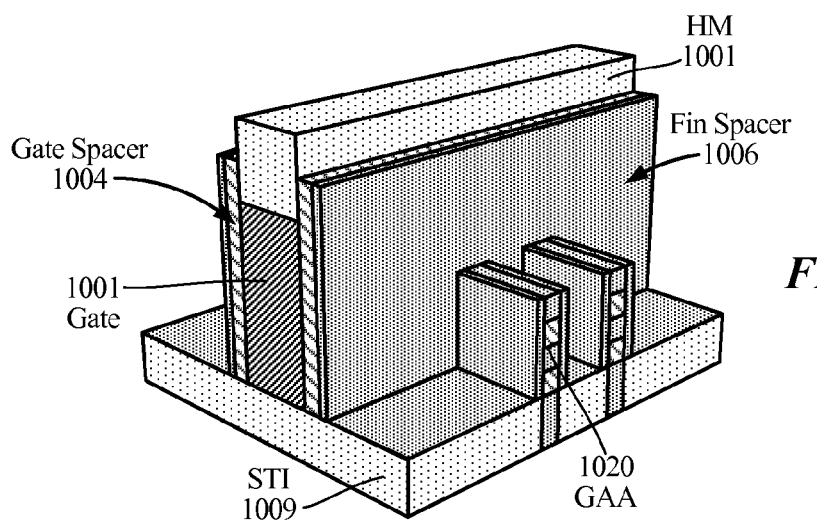
Figure 10D:
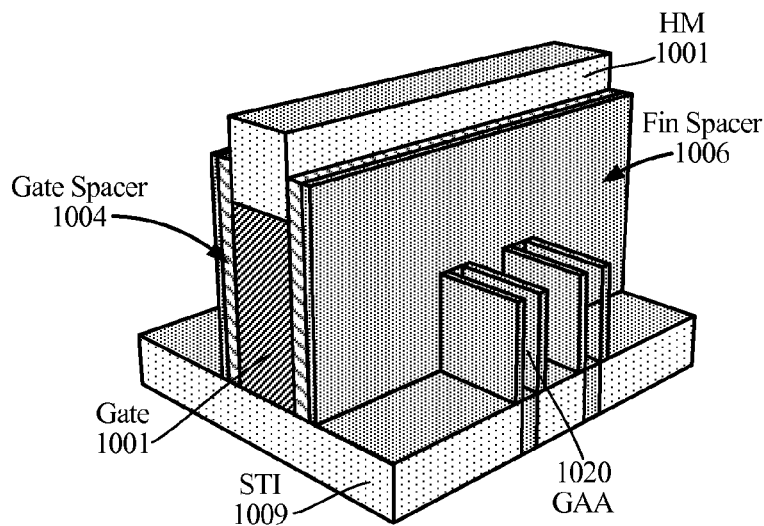
Figure 10E:
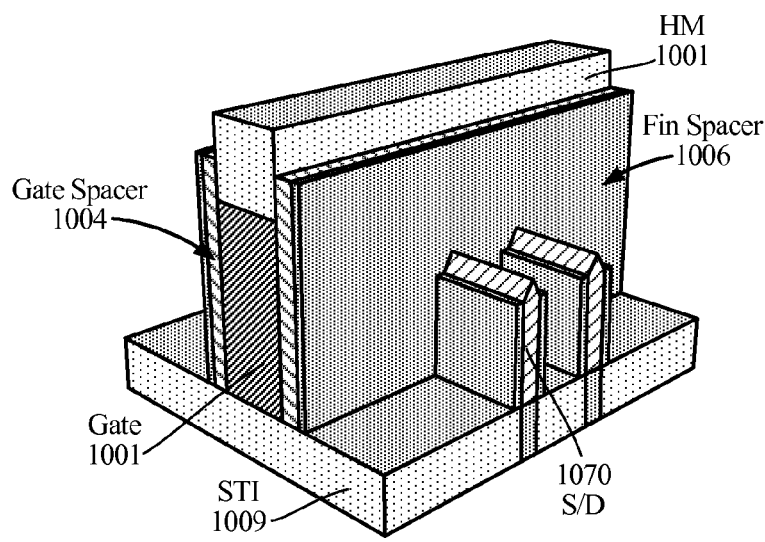
Figure 10F:
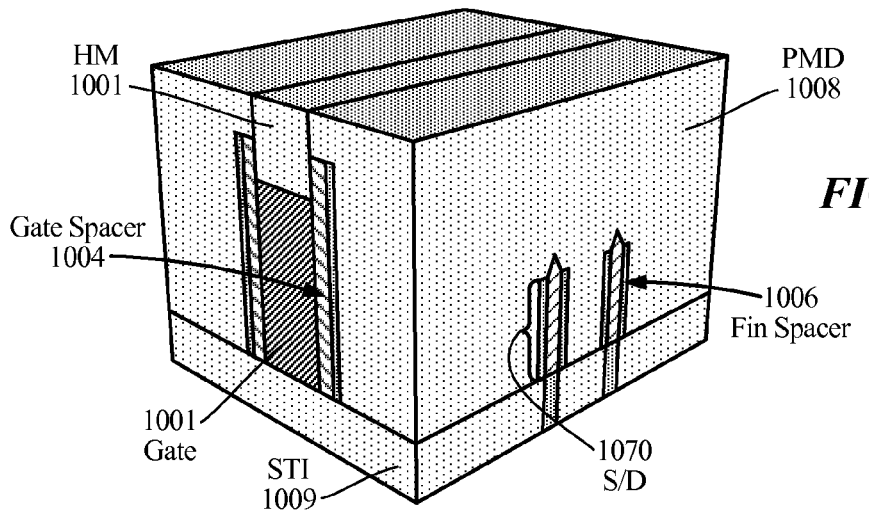
Figure 10G:
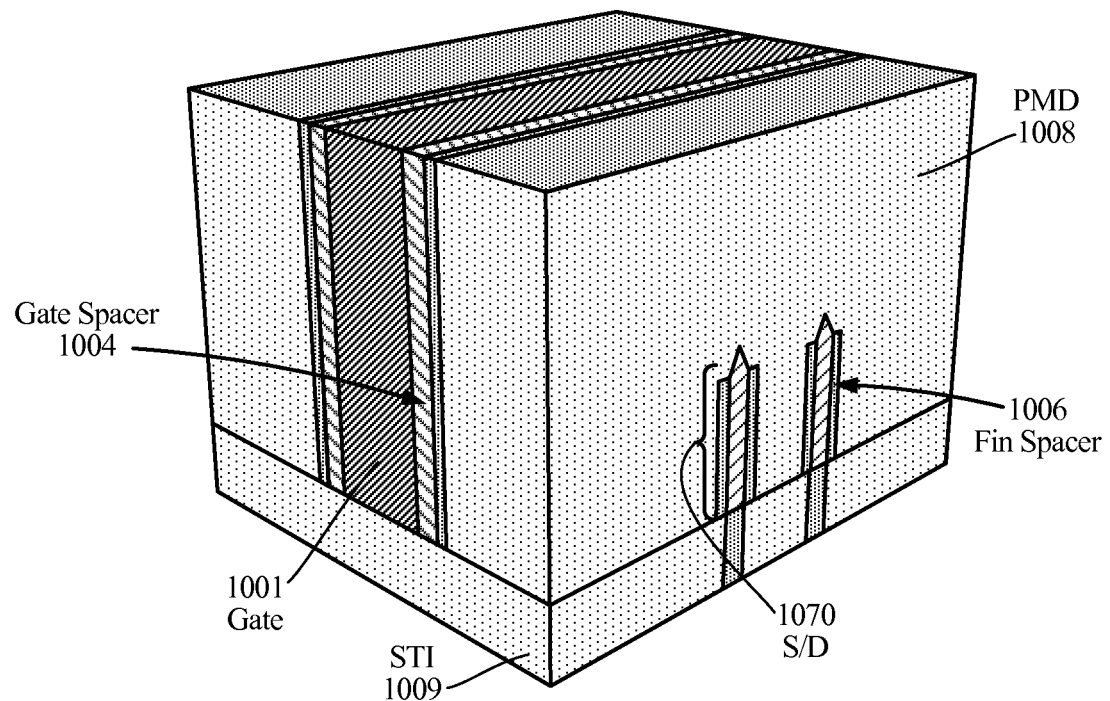
Figure 10H:
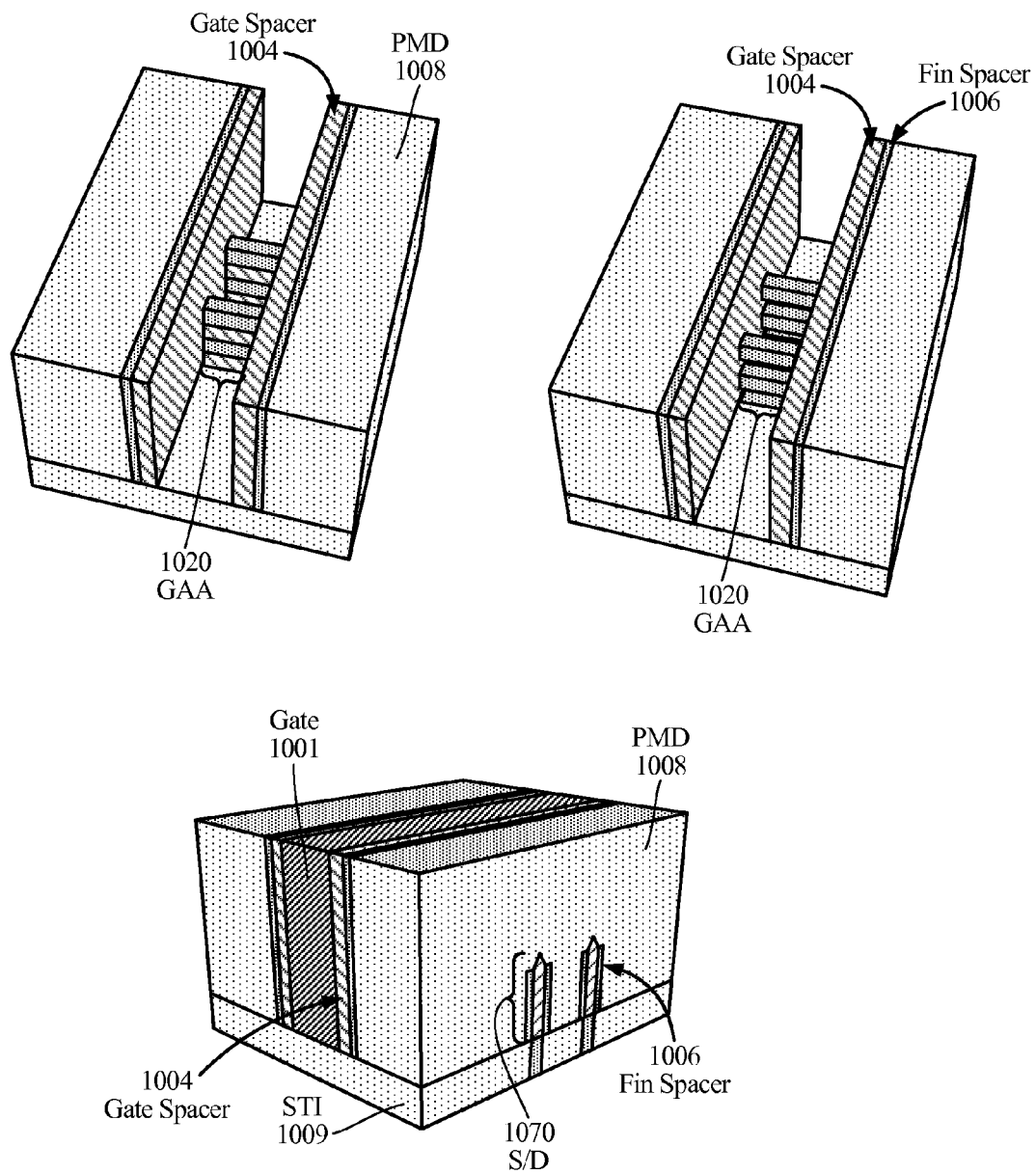
Figure 10I:
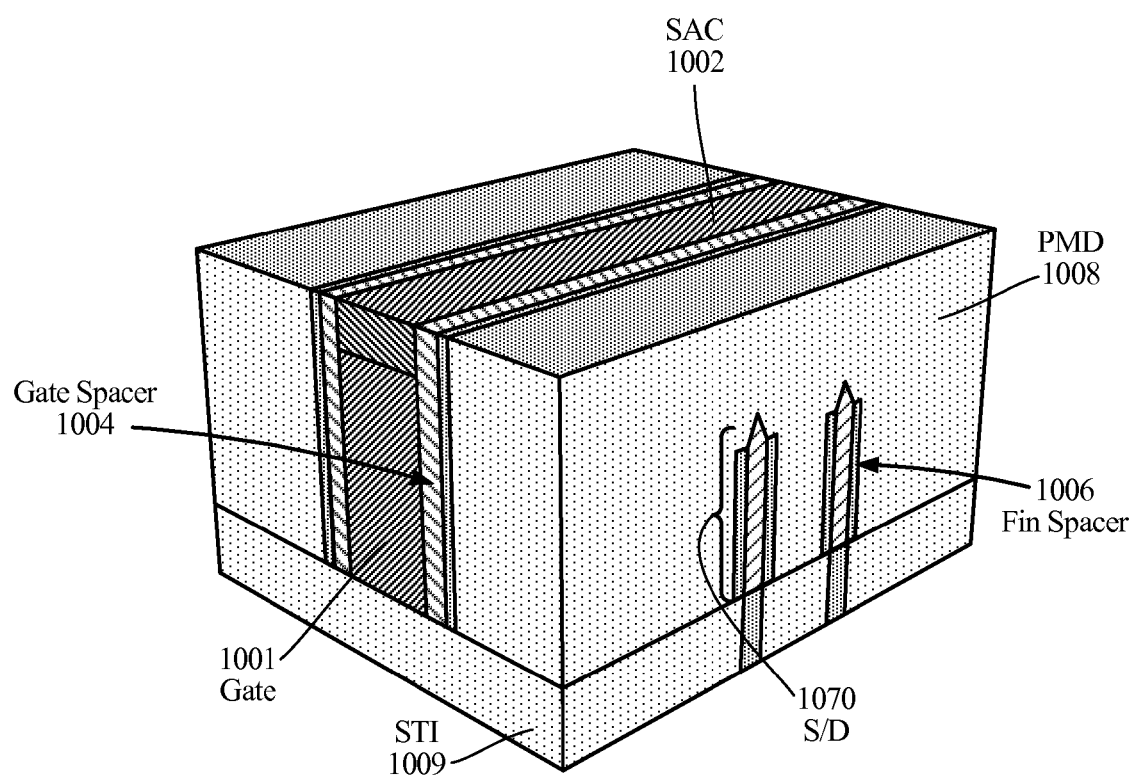
Figure 10J:
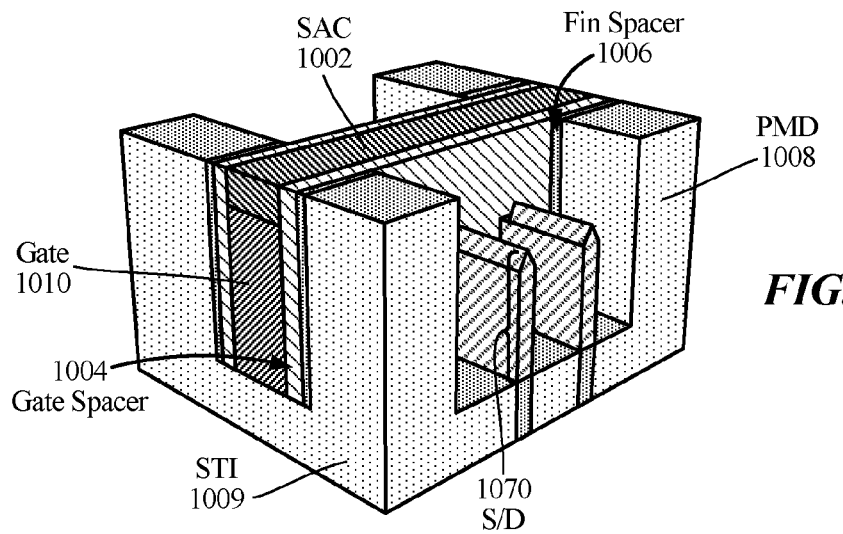
Figure 10K:
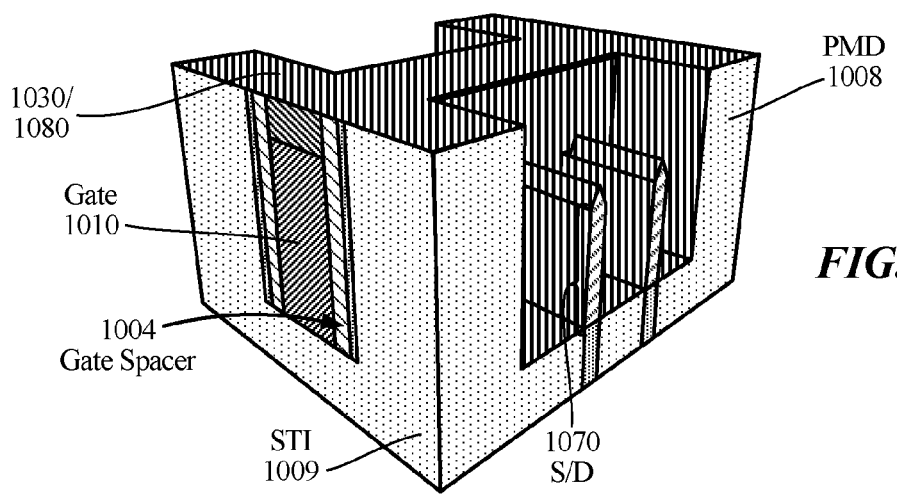
Figure 10L:
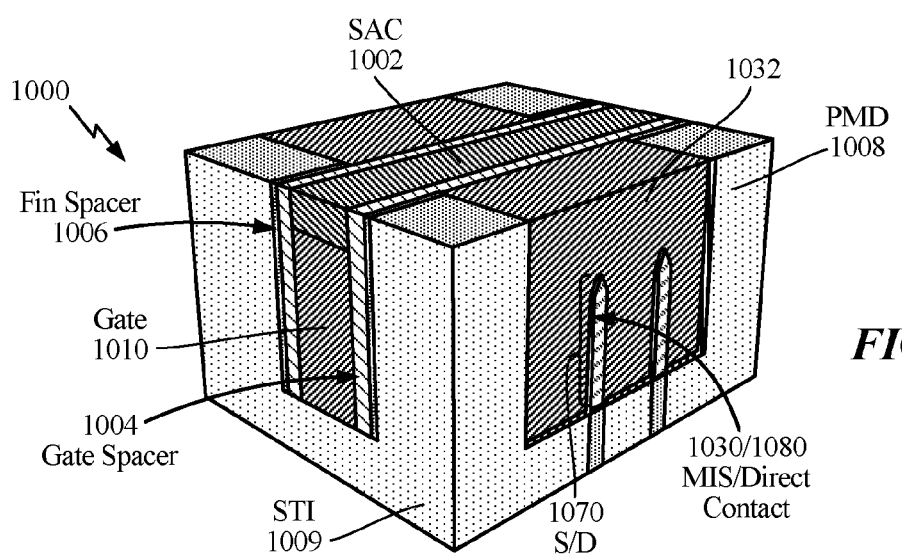
Figure 11A:
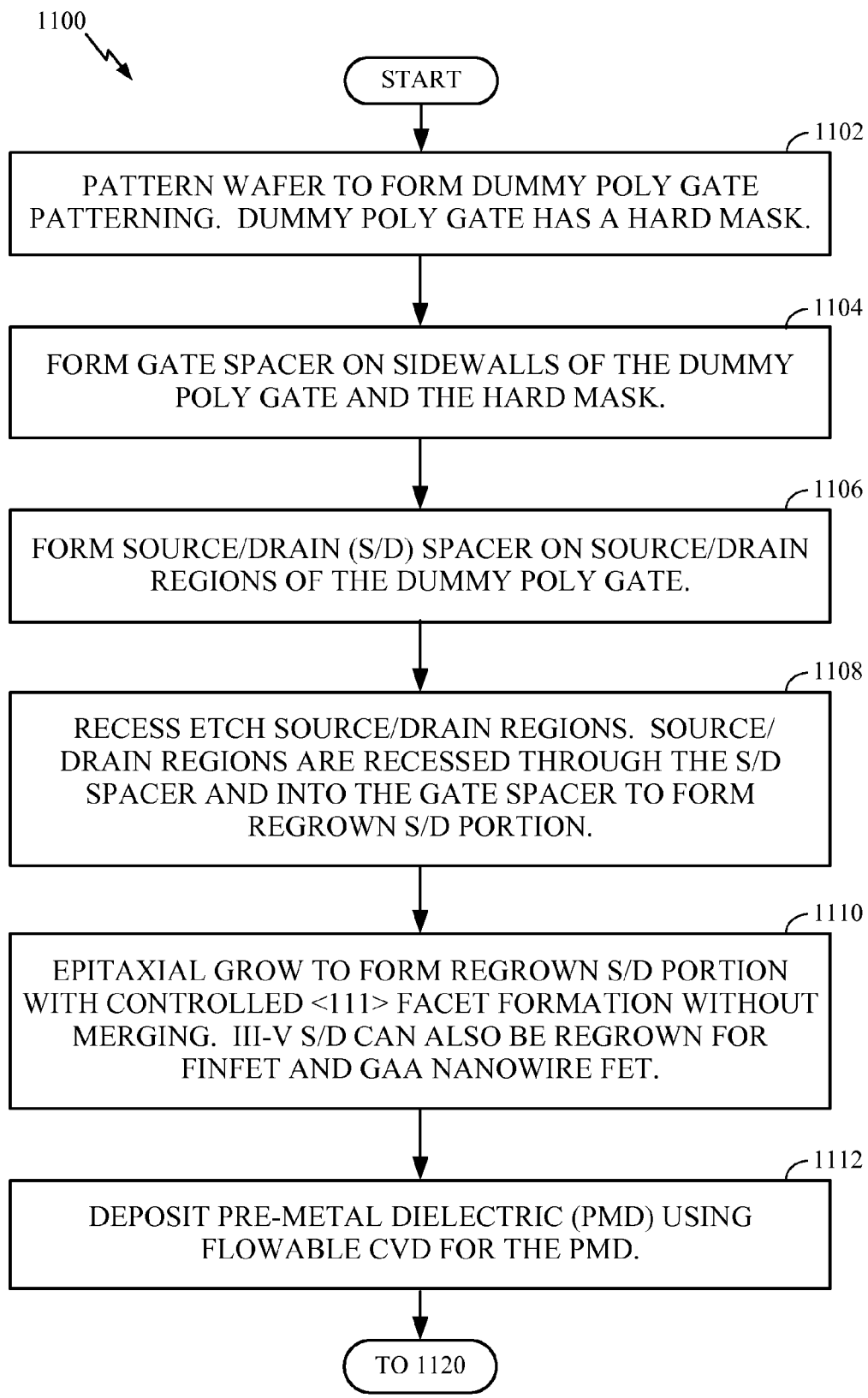
FIGS. 11A and 11B illustrate a method for fabricating a semiconductor device including a contact wrap around structure in accordance with aspects of the present disclosure.

FIG. 11A illustrates a method 1100 for fabricating a semiconductor device including a contact wrap around structure according to aspects of the present disclosure. The process described in FIGS. 11A and 11B enables formation of the fin-based device 900, as shown in FIGS. 9A-9L or the GAA nanowire-based device 1000, as shown in FIGS. 10A-10L, which correspond to FIGS. 9A-9L. In block 1102, an incoming wafer is shown after a dummy poly gate patterning process is completed to form a dummy poly gate (e.g., silicon (Si)). For example, as shown in FIGS. 9A/10A, a hard mask 901/1001 (e.g., oxide) is arranged on a gate 910/1010 during the patterning of the gate 910/1010. The gate 910/1010 is supported by a shallow trench isolation (STI) region 909/1009, which may be supported by a substrate. The source/drain regions of the gate 910/1010 will be provided by regrown source/drains 970/1070, as shown in FIGS. 9E/10E. In addition, the dummy poly gate is also replaced to provide the gate 910/1010, as shown in FIGS. 9L/10L.

Referring again to FIG. 11A, in block 1104, a gate spacer (e.g., a nitride-based low-K gate spacer) is formed on sidewalls of the dummy gate and the hard mask. For example, as shown in FIGS. 9B/10B, a gate spacer 904/1004 is formed on the sidewalls of the gate 910/1010 and the hard mask 901/1001. In block 1106, a source/drain (S/D) spacer is formed. For example, as shown in FIGS. 9C/10C, a source/drain spacer 906/1006 is formed on the sidewalls of the gate 910/1010 and the hard mask 901/1001. As shown in FIG. 9A, the fin spacer 906 is formed on the sidewalls of the fins 920. As shown in FIG. 10A, a gate-all-around (GAA) nanowire spacer 1006 is formed on the sidewalls of the GAA nanowire 1020.

Referring again to FIG. 11A, in block 1108, a recess etch of the source/drain regions is performed. The source/drain regions are recessed through the S/D spacer and into the gate spacer to form regrown source/drain portions. As shown in FIG. 9D, the fins 920 are recess etched through the fin spacer 906 and the gate spacer 904. As shown in FIG. 10D, the GAA nanowire 1020 is recess etched through the GAA spacer 1006 and the gate spacer 1004. A lightly doped drain (LDD) implant is no longer provided from the regrown source/drain (S/D) regions, as shown in FIGS. 9E/10E.

Referring again to FIG. 11A, in block 1110, epitaxial growth is used to form regrown S/D portions. The regrown S/D portions may be formed with a controlled (e.g., <111> Miller index) facet formation without merging the regrown S/D portions. For example, epitaxial growth of phosphorous doped silicon (SiP), carbon phosphorous doped silicon (SiCP), or phosphorous doped germanium (GeP) may form regrown S/D regions of an n-type (e.g., an NFET). Similarly, epitaxial growth of boron doped silicon germanium (SiGeB), or boron doped germanium (GeB) may form regrown S/D regions of a p-type (e.g., a PFET). As shown in FIGS. 9E/10E, the regrown S/D regions 970/1070 are formed using the noted epitaxial growth. In this arrangement, the regrown S/D regions 970/1070 have substantially parallel sidewalls. As shown in FIG. 10E, the GAA nanowire-based device 1000 includes both n-type and p-type S/D regions 1070. In block 1112, a pre-metal dielectric (PMD) material is deposited. As shown in FIGS. 9F/10F, the PMD 908/1008 is deposited on the fin-based device 900 or the GAA nanowire-based device 1000.

Figure 11B:
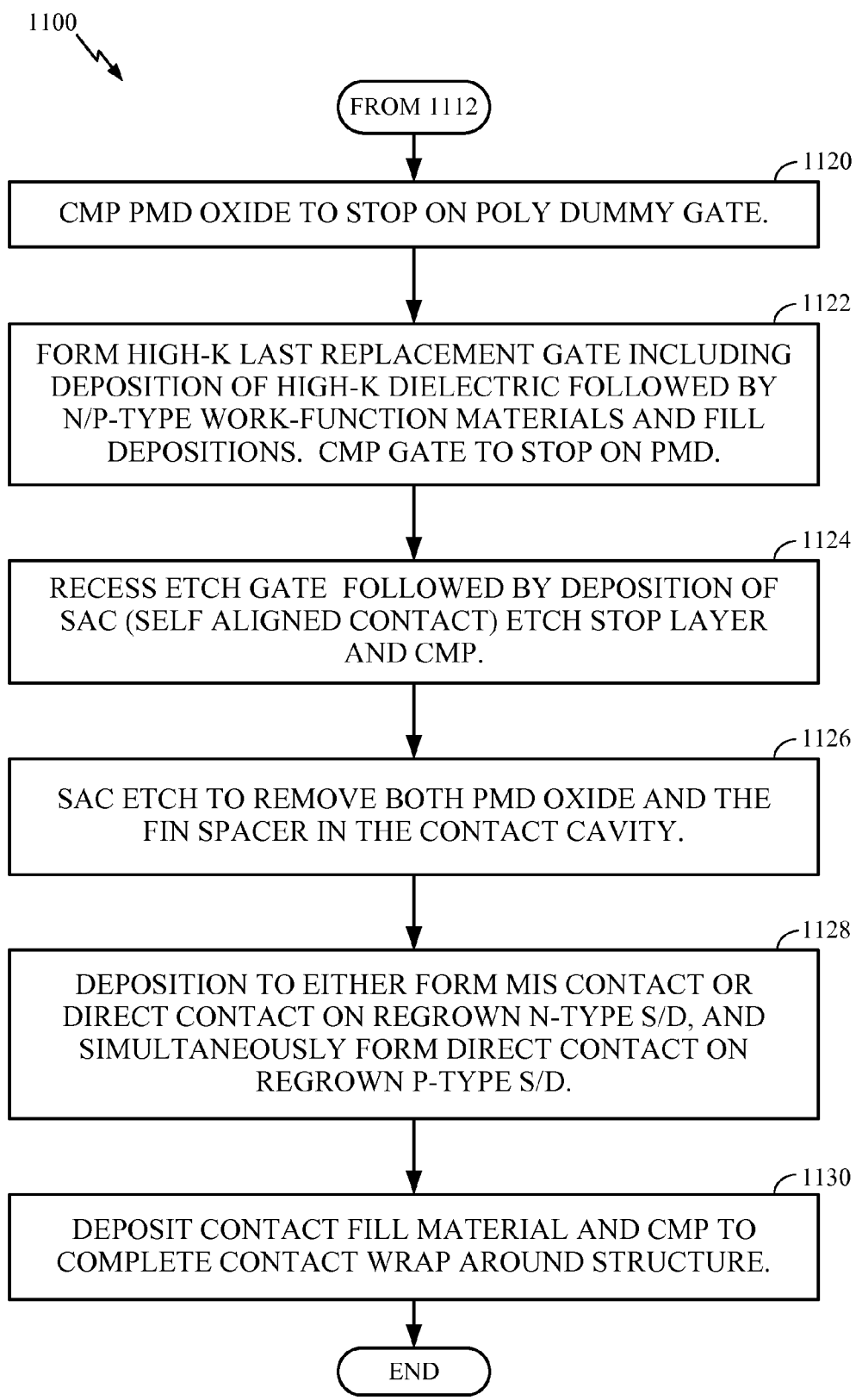

FIG. 11B further illustrates the method 1100 of FIG. 11A for fabricating a semiconductor device including a contact wrap around structure according to aspects of the present disclosure. In block 1120, a chemical mechanical polish (CMP) process is performed on the PMD material to stop on and expose the poly dummy gate. As shown in FIGS. 9G/10G, the CMP process is performed on the PMD 908/1008 to expose the gate 910/1010. In block 1122, a replacement gate process is performed to replace the dummy gate with an active gate. As shown in FIGS. 9H/10H, the dummy date is removed to form the gate 910/1010 and exposing the gate 910/1010 using a CMP process that stops on the PMD 908/1008.

As shown in FIG. 10H, a high-K layer 1016 is deposited on the exposed portion of the GAA nanowire 1020. A first work function material (WFM) (e.g., an n-type WFM) is deposited on a first exposed portion of the GAA nanowire 1020 to form an NFET. In addition, a second work function material (WFM) (e.g., a p-type WFM) is deposited on a second exposed portion of the GAA nanowire 1020 to form a PFET. A conductive layer 1012 (e.g., tungsten (W) or cobalt (Co)) is deposited on the first WFM and the second WFM to complete formation of the gate 1010. Finally, a CMP process is performed to stop on the PMD 1008.

Referring again to FIG. 11B, in block 1124 the gate is recess etched followed by deposition of a self-aligned contact (SAC) that operates as an etch stop layer during a subsequent CMP process to complete formation of the gate. As shown in FIGS. 9I/10I, a conductive layer is etched and the SAC 902/1002 is deposited. A CMP process may be performed on the SAC 902/1002. Following complete of the gate 910/1010, a wrap-around contact is formed to surround the regrown S/D regions 970/1070.

In block 1126 an SAC etch is performed to remove both the PMD oxide and the spacer in the contact cavity. The SAC etch may be a low/no damage etch to avoid damage to the regrown S/D regions. An atomic layer etch (ALE) may expose the regrown S/D regions. As shown in FIGS. 9J/10J, an etch of the PMD 908/1008 and the fin spacer 906/GAA spacer 1006 is performed to expose the regrown SD regions 970/1070 and stop on the STI 909/1009 and the gate spacer 904/1004. In block 1128, a deposition forms a metal-oxide-semiconductor (MIS) contact or a direct contact surrounding the regrown S/D regions. As shown in FIGS. 9K/10K, an MIS contact 930/1030 or a direct contact 980/1080 is formed to surround the regrown S/D regions 970/1070. In block 1130, a contact fill material (e.g., 932/1032) is deposited on the MIS contact or a direct contact surrounding the regrown S/D regions. As shown in FIGS. 9L/10L, an MIS contact 930/1030 or a direct contact 980/1080 is formed to surround the regrown S/D regions 970/1070 to complete formation of the fin-based device 900 or the GAA nanowire-based device 1000.

Aspects of the present disclosure include an innovative integration flow to form wrap-around contacts on highly scaled fins with metal-insulator-semiconductor (MIS) contacts or direct contacts to drastically reduce contact resistance. Additional aspects of the present disclosure can also provide an MIS contact or a direct contact to the source/drain of gate-all-around (GAA) nanowires-based devices and other like semiconductor devices to reduce contact resistance. A contact wrap around structure, including wrap-around contacts, may enable operation within the reduced device geometries of advanced logic technologies, such as seven (7) nanometer logic technology and beyond. A contact wrap-around structure may be fabricated using existing materials and process capabilities, while providing a substantial contact resistance reduction.

According to an aspect of the present disclosure, a fin-based structure including a gate stack is described. In one configuration, the fin-based structure includes means for contacting substantially all surface area of a regrown source/drain region of the fin-based structure proximate to the gate stack. The contacting means may be the wrap-around contact 610, the MIS contact 830 or the direct contact 880. In another aspect, the aforementioned means may be any module or any apparatus or material configured to perform the functions recited by the aforementioned means.

Figure 12:
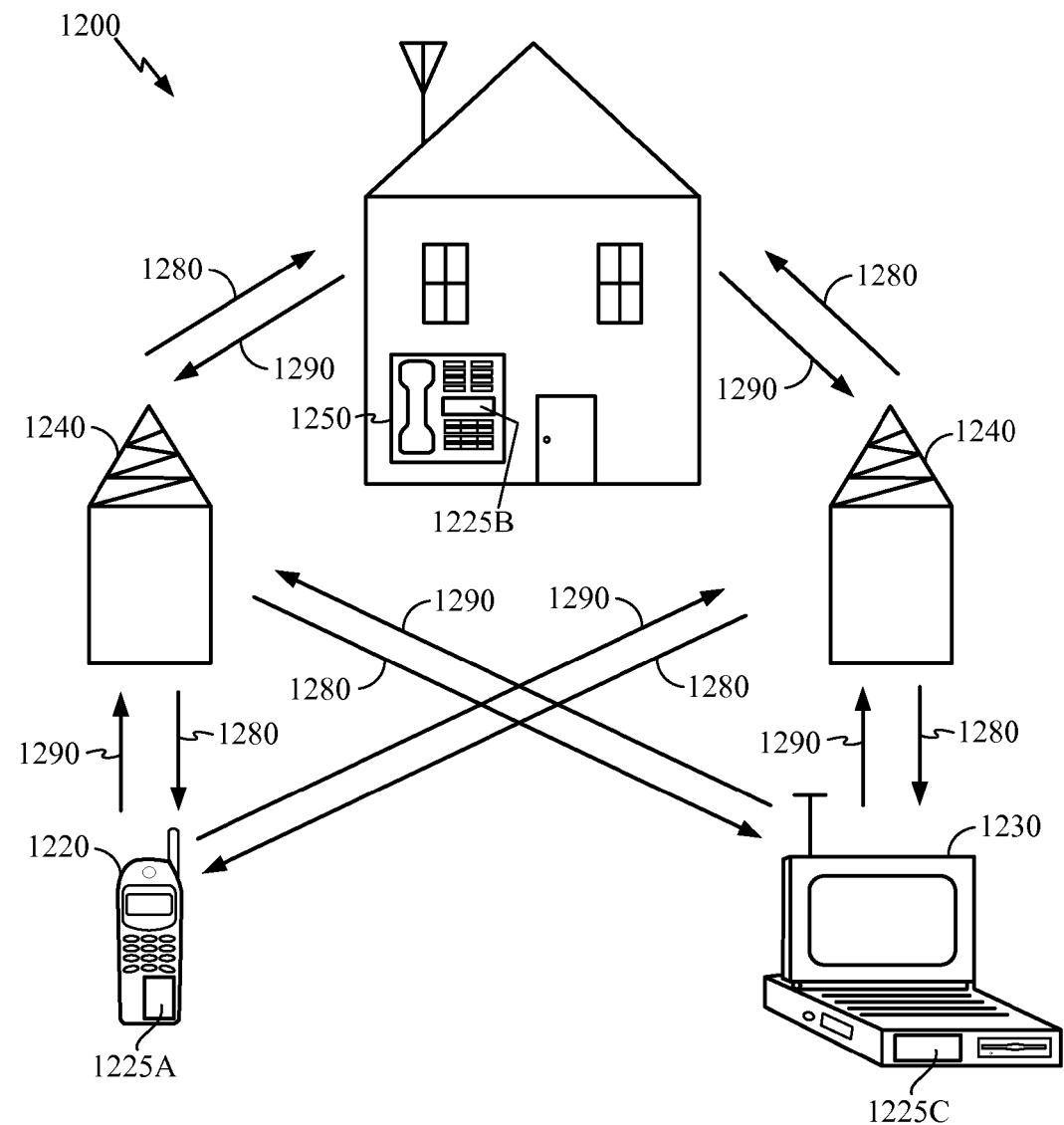
FIG. 12 is a block diagram showing an exemplary wireless communication system in which aspects of the disclosure may be advantageously employed.

FIG. 12 is a block diagram showing an exemplary wireless communication system 1200 in which an aspect of the disclosure may be advantageously employed. For purposes of illustration, FIG. 12 shows three remote units 1220, 1230, and 1250 and two base stations 1240. It will be recognized that wireless communication systems may have many more remote units and base stations. Remote units 1220, 1230, and 1250 include IC devices 1225A, 1225C, and 1225B that include the disclosed contacts. It will be recognized that other devices may also include the disclosed contacts, such as the base stations, switching devices, and network equipment. FIG. 12 shows forward link signals 1280 from the base station 1240 to the remote units 1220, 1230, and 1250 and reverse link signals 1290 from the remote units 1220, 1230, and 1250 to base stations 1240.

In FIG. 12, remote unit 1220 is shown as a mobile telephone, remote unit 1230 is shown as a portable computer, and remote unit 1250 is shown as a fixed location remote unit in a wireless local loop system. For example, the remote units may be a mobile phone, a hand-held personal communication systems (PCS) unit, a portable data unit such as a personal data assistant, a GPS enabled device, a navigation device, a set top box, a music player, a video player, an entertainment unit, a fixed location data unit such as meter reading equipment, or other devices that store or retrieve data or computer instructions, or combinations thereof. Although FIG. 12 illustrates remote units according to the aspects of the disclosure, the disclosure is not limited to these exemplary illustrated units. Aspects of the disclosure may be suitably employed in many devices, which include the disclosed semiconductor devices.

Figure 13:
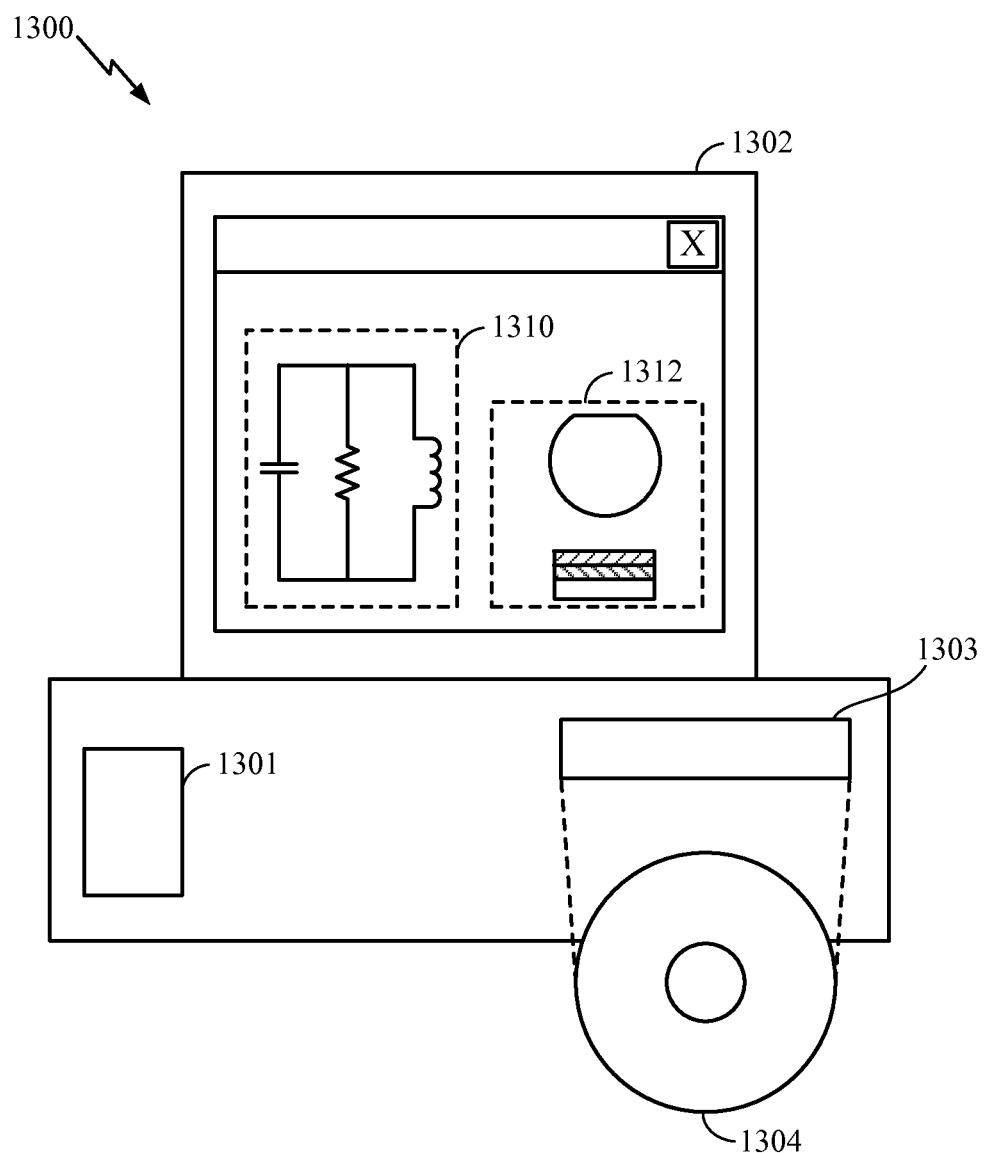
FIG. 13 is a block diagram illustrating a design workstation used for circuit, layout, and logic design of a fin-based structure according to one configuration.

FIG. 13 is a block diagram illustrating a design workstation used for circuit, layout, and logic design of a fin-based structure, such as the contacts disclosed above. A design workstation 1300 includes a hard disk 1301 containing operating system software, support files, and design software such as Cadence or OrCAD. The design workstation 1300 also includes a display 1302 to facilitate design of a circuit 1310 or a fin-based structure 1312 such as a contact. A storage medium 1304 is provided for tangibly storing the design of the circuit 1310 or the fin-based structure 1312. The design of the circuit 1310 or the fin-based structure 1312 may be stored on the storage medium 1304 in a file format such as GDSII or GERBER. The storage medium 1304 may be a CD-ROM, DVD, hard disk, flash memory, or other appropriate device. Furthermore, the design workstation 1300 includes a drive apparatus 1303 for accepting input from or writing output to the storage medium 1304.

Data recorded on the storage medium 1304 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 1304 facilitates the design of the circuit 1310 or the fin-based structure 1312 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The steps of a method or algorithm described in connection with the disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can include RAM, ROM, EEPROM, CD-ROM or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "a step for."

What is claimed is:

1. A semiconductor device, comprising:
a gate stack;
a gate spacer on sidewalls of the gate stack;
a fin spacer on sidewalls of the gate spacer;
a pre-metal dielectric on the fin spacer; and
a wrap-around non-silicide contact on the gate spacer, the fin spacer, and the pre-metal dielectric, the wrap-around non-silicide contact extending around and contacting substantially all surface area of a regrown source/drain region of a fin supported by a base fin-portion extending from a first surface to an opposing second surface of an isolation region of the semiconductor device proximate to the gate stack, the regrown source/drain region of the fin having substantially parallel sidewalls, a fin width of the base-fin portion being substantially equal to a fin width of a widest portion of the regrown source/drain region of the fin.

2. The semiconductor device of claim 1, in which the semiconductor device comprises a fin field-effect transistor (FinFET).

3. The semiconductor device of claim 2, in which the gate stack is on a surface of the base fin-portion.

4. The semiconductor device of claim 3, in which the base fin-portion comprises silicon, germanium, or silicon germanium.

5. The semiconductor device of claim 1, in which the wrap-around non-silicide contact comprises a metal insulator semiconductor (MIS) contact or a direct contact.

6. The semiconductor device of claim 5, in which the wrap-around non-silicide contact comprises the MIS contact coupled to an n-type metal oxide semiconductor (NMOS) region of the semiconductor device or the wrap-around non-silicide contact comprises the direct contact coupled to a p-type metal oxide semiconductor (PMOS) region of the semiconductor device.

7. The semiconductor device of claim 6, in which the wrap-around non-silicide contact comprises the MIS contact coupled to the NMOS region of the semiconductor device, and the MIS contact comprises:
a titanium oxide layer ($TiO_2$) on the NMOS region of the semiconductor device; and
a titanium layer (Ti) on the titanium oxide layer.

8. The semiconductor device of claim 6, in which the wrap-around non-silicide contact comprises the direct contact coupled to the PMOS region of the semiconductor device, and the direct contact comprises a titanium layer (Ti) on the PMOS region of the semiconductor device.

9. The semiconductor device of claim 1 integrated into a mobile phone, a set top box, a music player, a video player, an entertainment unit, a navigation device, a computer, a hand-held personal communication systems (PCS) unit, a portable data unit, and/or a fixed location data unit.

10. A semiconductor device, comprising:
a gate stack;
a gate spacer on sidewalls of the gate stack;
a fin spacer on sidewalls of the gate spacer;
a pre-metal dielectric on the fin spacer; and
means for contacting the gate spacer, the fin spacer, the pre-metal dielectric, and substantially all surface area of a regrown source/drain region of a fin supported by a base fin-portion extending from a first surface to an opposing second surface of an isolation region of the semiconductor device proximate to the gate stack, the regrown source/drain region of the fin having substantially parallel sidewalls, and a fin width of the base-fin portion being substantially equal to a fin width of a widest portion of the regrown source/drain region of the fin.

11. The semiconductor device of claim 10, in which the semiconductor device comprises a fin field-effect transistor (FinFET).

12. The semiconductor device of claim 11, in which the gate stack is on a surface of the base fin-portion.

13. The semiconductor device of claim 12, in which the base fin-portion comprises silicon, germanium, or silicon germanium.

14. The semiconductor device of claim 10 integrated into a mobile phone, a set top box, a music player, a video player, an entertainment unit, a navigation device, a computer, a hand-held personal communication systems (PCS) unit, a portable data unit, and/or a fixed location data unit.

* * * * *